US012813023B2

(12) United States Patent
Park et al.

(10) Patent No.: US 12,813,023 B2
(45) Date of Patent: Nov. 24, 2026

(54) DISPLAY DEVICE AND MANUFACTURING METHOD THEREOF

(71) Applicant: Samsung Display Co., LTD., Yongin-si (KR)

(72) Inventors: Jeong Su Park, Yongin-si (KR); Hyun Kim, Yongin-si (KR); Myeong Hun Song, Yongin-si (KR); Jeong Kook Wang, Yongin-si (KR); Jong Chan Lee, Yongin-si (KR); Yong Tae Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 712 days.

(21) Appl. No.: 17/697,747

(22) Filed: Mar. 17, 2022

(65) Prior Publication Data

US 2022/0320377 A1 Oct. 6, 2022

(30) Foreign Application Priority Data

Apr. 6, 2021 (KR) ........................ 10-2021-0044823

(51) Int. Cl.
*H10H 20/831* (2025.01)
*H10H 20/01* (2025.01)

(52) U.S. Cl.
CPC ........ *H10H 20/8312* (2025.01); *H10H 20/01* (2025.01); *H10H 20/032* (2025.01)

(58) Field of Classification Search
CPC .. H10H 20/8312; H10H 20/01; H10H 20/032; H10H 29/49; H10H 29/842; H10H 29/32; H10H 29/012; H10H 29/03; H10H 29/10; H10H 20/832; H10H 20/853;
(Continued)

(56) References Cited

U.S. PATENT DOCUMENTS

| | | | | |
|---|---|---|---|---|
| 6,090,698 A * | 7/2000 | Lee | H10W 20/072 438/622 |
| 11,349,054 B2 | 5/2022 | Chang et al. | |
| 11,749,783 B2 | 9/2023 | Basrur et al. | |

(Continued)

FOREIGN PATENT DOCUMENTS

| | | |
|---|---|---|
| CN | 112447807 A | 3/2021 |
| CN | 112514086 A | 3/2021 |

(Continued)

*Primary Examiner* — Brent A. Fairbanks
*Assistant Examiner* — Michael Anguiano
(74) *Attorney, Agent, or Firm* — Womble Bond Dickinson (US) LLP

(57) ABSTRACT

A display device includes: a first electrode and a second electrode that are spaced apart from each other; a light emitting element between the first electrode and the second electrode; a first connecting electrode contacting the first electrode and a first end of the light emitting element; a second connecting electrode contacting the second electrode and a second end of the light emitting element; a first insulating pattern between the first connecting electrode and the second connecting electrode above the light emitting element; and a second insulating pattern including first inorganic layers and second inorganic layers that are alternately stacked with each other between the first connecting electrode and the second connecting electrode above the first insulating pattern.

13 Claims, 12 Drawing Sheets

(58) Field of Classification Search
CPC ................ H10H 20/857; H10H 29/142; H01L 25/0753; H10D 86/443
See application file for complete search history.

(56) References Cited

U.S. PATENT DOCUMENTS

2002/0055243 A1* 5/2002 Lee ..................... H10W 20/072 438/586
2005/0275104 A1* 12/2005 Stamper ............ H01L 21/31116 257/E21.252
2009/0001407 A1* 1/2009 Osawa ................. H10H 20/835 438/22
2009/0146168 A1* 6/2009 Kwon .................. H10H 20/841 257/E21.232
2009/0315061 A1* 12/2009 Andrews ................ H10H 20/85 438/26
2014/0217370 A1* 8/2014 Kim ..................... H10K 59/124 257/40
2016/0056352 A1* 2/2016 Koike .................... H10H 20/82 438/27
2016/0118543 A1* 4/2016 Lim ..................... H10H 20/833 257/98
2017/0141260 A1* 5/2017 Chen .................... H10H 20/841
2018/0219131 A1* 8/2018 Park ..................... H10H 20/831
2018/0254380 A1* 9/2018 Muroo ................... H10H 20/82
2019/0312188 A1* 10/2019 Kayama ............... H10H 20/857
2020/0013766 A1 1/2020 Kim
2020/0161499 A1 5/2020 Ota et al.
2020/0176656 A1* 6/2020 Bae ........................ H10H 20/01
2020/0274328 A1* 8/2020 Park ................... H10H 20/8142
2021/0167253 A1 6/2021 Basrur et al.
2022/0059739 A1* 2/2022 Li .......................... H10H 20/84

FOREIGN PATENT DOCUMENTS

KR 10-2020-0013190 A 2/2020
KR 10-2020-0068150 A 6/2020
KR 10-2020-0077671 A 7/2020
WO WO-2020130249 A1 * 6/2020 ............ H10W 90/00

* cited by examiner

BNP: BNP1~BNP3
ALE: ALE1~ALE4
LD: LD1~LD4
ELT: ELT1~ELT5
CNT: CNT1,CNT2
CH: CH1~CH4
OPA: OPA1~OPA3
SPA: SPA1,SPA2

DISPLAY DEVICE AND MANUFACTURING METHOD THEREOF

CROSS-REFERENCE TO RELATED APPLICATION

This application claims priority to and the benefit of Korean Patent Application No. 10-2021-0044823 filed in the Korean Intellectual Property Office on Apr. 6, 2021, the entire content of which is incorporated herein by reference.

BACKGROUND

1. Field

The present disclosure relates to a display device and a manufacturing method thereof.

2. Description of the Related Art

As interest in display devices is increasing research and development for the display devices are continuously conducted.

SUMMARY

The present disclosure provides a display device and a manufacturing method thereof that may simplify a manufacturing process of the display device by reducing the number of masks.

The aspects of embodiments of the present disclosure are not limited to the aspects mentioned above, and other technical aspects that are not mentioned may be clearly understood to a person of an ordinary skill in the art using the following description.

In one or more embodiments provide a display device including: a first electrode and a second electrode that are spaced from each other; a light emitting element between the first electrode and the second electrode; a first connecting electrode contacting the first electrode and a first end of the light emitting element; a second connecting electrode contacting the second electrode and a second end of the light emitting element; a first insulating pattern between the first connecting electrode and the second connecting electrode above the light emitting element; and a second insulating pattern comprising first inorganic layers and second inorganic layers that are alternately stacked with each other between the first connecting electrode and the second connecting electrode above the first insulating pattern.

A width of a first inorganic layer of the first inorganic layers may be greater than that of a second inorganic layer of the second inorganic layers.

The width of the first inorganic layer may be less than a width of the light emitting element.

The first inorganic layer may include silicon oxide, and the second inorganic layer may include silicon nitride.

The display device may further include a conductive pattern on a side surface of the first inorganic layer.

The conductive pattern may not contact the second inorganic layer.

The conductive pattern may be separated from the first connecting electrode and the second connecting electrode.

The conductive pattern may include a same material as the first connecting electrode and the second connecting electrode.

The first connecting electrode may contact a first side of the first insulating pattern, and the second connecting electrode may contact a second side of the first insulating pattern.

The first insulating pattern may expose the first end and the second end of the light emitting element.

The first insulating pattern may include an inorganic insulating material.

The first insulating pattern may include an organic insulating material.

The first connecting electrode and the second connecting electrode may include a same material.

The first connecting electrode and the second connecting electrode may be formed at a same layer.

Other embodiments provide a manufacturing method of a display device, including: forming a first electrode and a second electrode that are spaced from each other; aligning a light emitting element between the first electrode and the second electrode; forming a first insulating pattern on the light emitting element; forming a second insulating pattern including first inorganic layers and second inorganic layers that are alternately stacked with each other; and forming on the light emitting element, a connecting electrode layer including a first connecting electrode on a first end of the light emitting element and a second connecting electrode on a second end of the light emitting element, the first connecting electrode and the second connecting electrode being separated by the second insulating pattern.

In the forming of the second insulating pattern, the second inorganic layers may be etched more quickly than the first inorganic layers.

The connecting electrode layer may further include a first conductive pattern on a side surface of a first inorganic layer of the first inorganic layers.

The connecting electrode layer may further include a second conductive pattern on the second insulating pattern.

The first connecting electrode, the second connecting electrode, the first conductive pattern, and the second conductive pattern may be concurrently formed by a same process.

The manufacturing method of the display device may further include removing the second conductive pattern.

Particularities of other embodiments are included in the detailed description and drawings.

According to one or more embodiments of the present disclosure, because connecting electrodes may be separated by side protrusions and depressions of a second insulating pattern, even if the connecting electrodes are formed at the same time, a short circuit between the connecting electrodes may be reduced or prevented. Accordingly, it is possible to reduce the number of masks and simplify a manufacturing process of a display device.

Aspects of embodiments of the present disclosure are not limited by what is illustrated in the above, and more various aspects are included in the present specification.

DETAILED DESCRIPTION

Figure 1:
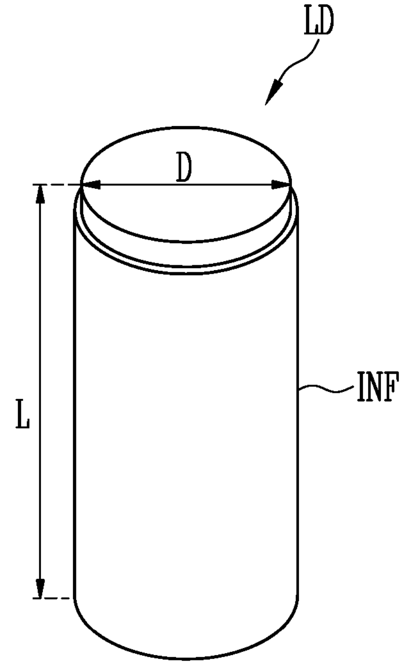
FIG. 1 and FIG. 2 illustrate a perspective view and a cross-sectional view of a light emitting element according to one or more embodiments, respectively.

Aspects of embodiments of the present disclosure and methods of accomplishing the same may be understood more readily by reference to the following detailed description of embodiments of the present disclosure and the accompanying drawings. The present disclosure may, however, be embodied in different forms and should not be construed as limited to the embodiments set forth herein. The embodiments of the present disclosure are provided so that the present disclosure will be thorough and complete, and will fully convey the spirit and scope of the present disclosure to those skilled in the art, and further, the present disclosure may be defined by scopes of the claims and their equivalents.

The terms used herein are for the purpose of describing particular embodiments only and is not intended to be limiting. As used herein, the singular forms "a," "an" and "the" are intended to include the plural forms as well, unless the context clearly indicates otherwise. It will be further understood that the terms "comprise" and/or "comprising," "include" or "including," and "have" or "having," when used in the present disclosure, specify the presence of stated elements, steps, operations, and/or devices, but do not preclude the presence or addition of one or more other elements, steps, operations, and/or devices.

In addition, the term "connection (connecting)" or "coupling" may comprehensively mean a physical and/or electrical connection (connecting) or coupling. Further, this may comprehensively mean a direct or indirect connection (connecting) or coupling, and an integrated or non-integrated connection (connecting) or coupling.

It will be understood that when an element or a layer is referred to as being cony another element or layer, it can be directly on another element or layer, or one or more intervening elements or layers may also be present. Throughout the specification, the same reference numerals denote the same constituent elements.

Although the terms "first," "second," and the like are used to describe various constituent elements, these constituent elements are not limited by these terms. These terms are used only to distinguish one constituent element from another constituent element. Therefore, the first constituent elements described below may be the second constituent elements within the technical spirit of the present disclosure.

Hereinafter, embodiments of the present disclosure will be described in detail with reference to the accompanying drawings.

Figure 2:
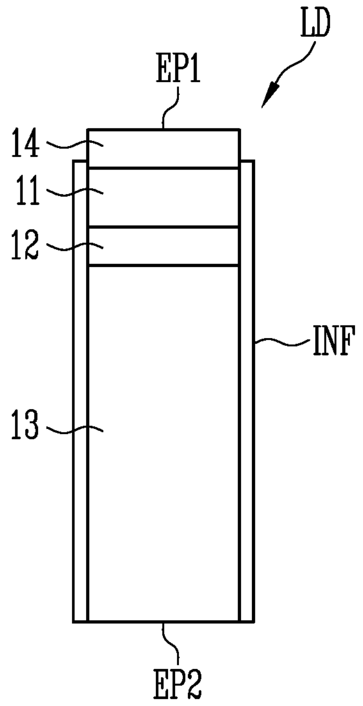

FIG. 1 and FIG. 2 illustrate a perspective view and a cross-sectional view of a light emitting element according to one or more embodiments, respectively. FIG. 1 and FIG. 2 illustrate a cylindrical shape light emitting element LD, but a type and/or shape of the light emitting element LD is not limited thereto.

Referring to FIG. 1 and FIG. 2, a light emitting element LD may include a first semiconductor layer 11, an active layer 12, a second semiconductor layer 13, and/or an electrode layer 14.

The light emitting element LD may be formed to have a cylindrical shape extending along one direction. The light emitting element LD may have a first end portion EP1 and a second end portion EP2. One of the first and second semiconductor layers 11 and 13 may be located on the first end portion EP1 of the light emitting element LD. The remaining one of the first and second semiconductor layers 11 and 13 may be located on the second end portion EP2 of the light emitting element LD. For example, the first semiconductor layer 11 may be located on the first end portion EP1 of the light emitting element LD, and the second semiconductor layer 13 may be located on the second end EP2 of the light emitting element LD.

In one or more embodiments, the light emitting element LD may be a light emitting element manufactured in a cylindrical shape through an etching method or the like. In the present specification, the "cylindrical shape" includes a rod-like shape or bar-like shape with an aspect ratio greater than 1, such as a circular cylinder or a polygonal cylinder, but a shape of a cross-section thereof is not limited.

The light emitting element LD may have a size as small as a nanometer scale to a micrometer scale. For example, the light emitting element LD may each have a diameter D (or width) and/or a length L ranging from a nanometer scale to a micrometer scale. However, the size of the light emitting element LD is not limited thereto, and the size of the light emitting element LD may be variously changed according to design conditions of various devices using a light emitting device using the light emitting element LD as a light source, for example, a display device.

The first semiconductor layer 11 may be a first conductive semiconductor layer. For example, the first semiconductor layer 11 may include a p-type semiconductor layer. For example, the first semiconductor layer 11 may include at least one semiconductor material of InAlGaN, GaN, AlGaN, InGaN, AlN, and InN, and may include a p-type semiconductor layer doped with a first conductive dopant such as Mg. However, the material included in the first semiconductor layer 11 is not limited thereto, and the first semiconductor layer 11 may be made of various materials.

The active layer 12 may be located between the first semiconductor layer 11 and the second semiconductor layer 13, and may be formed to have a single-quantum well structure or multi-quantum well structure. A position of the active layer 12 may be variously changed according to a type of the light emitting element LD. In one or more embodiments, a material such as AlGaN and InAlGaN may be used to form the active layer 12, and in addition, various materials may form the active layer 12. A clad layer doped with a conductive dopant may be formed at an upper portion and/or a lower portion of the active layer 12. For example, the cladding layer may be formed of AlGaN or InAlGaN.

The second semiconductor layer 13 is located on the active layer 12, and may include a semiconductor layer of a type that is different from that of the first semiconductor layer 11. The second semiconductor layer 13 may include an n-type semiconductor layer. For example, the second semiconductor layer 13 may include a semiconductor material of one of InAlGaN, GaN, AlGaN, InGaN, AlN, and InN, and may include an n-type semiconductor layer doped with a second conductive dopant such as Si, Ge, Sn, or the like. However, the material included in the second semiconductor layer 13 is not limited thereto, and the second semiconductor layer 13 may be made of various materials.

When a voltage of a threshold voltage or more is applied to respective ends (e.g., the first end portion EP1 and the second end portion EP2) of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

The electrode layer 14 may be located on the first end portion EP1 and/or the second end portion EP2 of the light emitting element LD. FIG. 2 illustrates a case in which the electrode layer 14 is formed on the first semiconductor layer 11, but the present disclosure is not necessarily limited thereto. For example, a separate electrode layer may be further located on the second semiconductor layer 13 at the second end portion EP2.

The electrode layer 14 may include a transparent metal or transparent metal oxide. As an example, the electrode layer 14 may include at least one of an indium tin oxide (ITO), an indium zinc oxide (IZO), a zinc oxide (ZnO), and a zinc tin oxide (ZTO), but is not limited thereto. As such, when the electrode layer 14 is made of the transparent metal or transparent metal oxide, light generated in the active layer 12 of the light emitting element LD may transmit through the electrode layer 14 to be emitted to the outside of the light emitting element LD.

The light emitting element LD may further include an insulating film INF formed on a surface (e.g., an outer circumferential surface) thereof. The insulating film INF may be directly located on surfaces (e.g., outer circumferential surfaces) of the first semiconductor layer 11, the active layer 12, the second semiconductor layer 13, and/or the electrode layer 14. The insulating film INF may expose the first and second end portions EP1 and EP2 of the light emitting element LD having different polarities. In one or more embodiments, the insulating film INF may expose side portions of the electrode layer 14 and/or the second semiconductor layer 13 that are adjacent to the first and second end portions EP1 and EP2 of the light emitting element LD.

The insulating film INF may include at least one of an aluminum oxide (AlOx), an aluminum nitride (AlNx), a silicon oxide (SiOx), a silicon nitride (SiNx), a silicon oxynitride (SiOxNy), a zirconium oxide (ZrOx), a hafnium oxide (HfOx), and a titanium oxide (TiOx). For example, the insulating film INF may be configured as a double layer, and respective layers configuring the double layer may include different materials. In this case, respective layers configuring the double layer of the insulating film INF may be formed by different processes. In one or more embodiments, the insulating film INF may be configured as a double layer made of an aluminum oxide (AlOx) and a silicon oxide (SiOx), but is not limited thereto. In one or more embodiments, the insulating film INF may be omitted.

When the insulating film INF is provided on the surface (e.g., the outer circumferential surface) of the light emitting element LD, it is possible to reduce or prevent the likelihood of the active layer 12 being short-circuited with at least one electrode (for example, at least one of electrodes connected to respective ends of the light emitting element LD). Therefore, electrical stability of the light emitting element LD may be secured. Further, it is possible to improve the life-span and efficiency of the light emitting element LD by reducing or minimizing surface-defects of the light emitting element LD.

A light emitting device including the light emitting element LD described above may be used in various types of devices that require a light source in addition to a display device. For example, the light emitting elements LD may be located in each pixel of a display panel, and the light emitting elements LD may be used as a light source of each pixel. However, an application field of the light emitting element LD is not limited to the above-described example. For example, the light emitting element LD may be used in other types of devices that require a light source, such as a lighting device.

Figure 3:
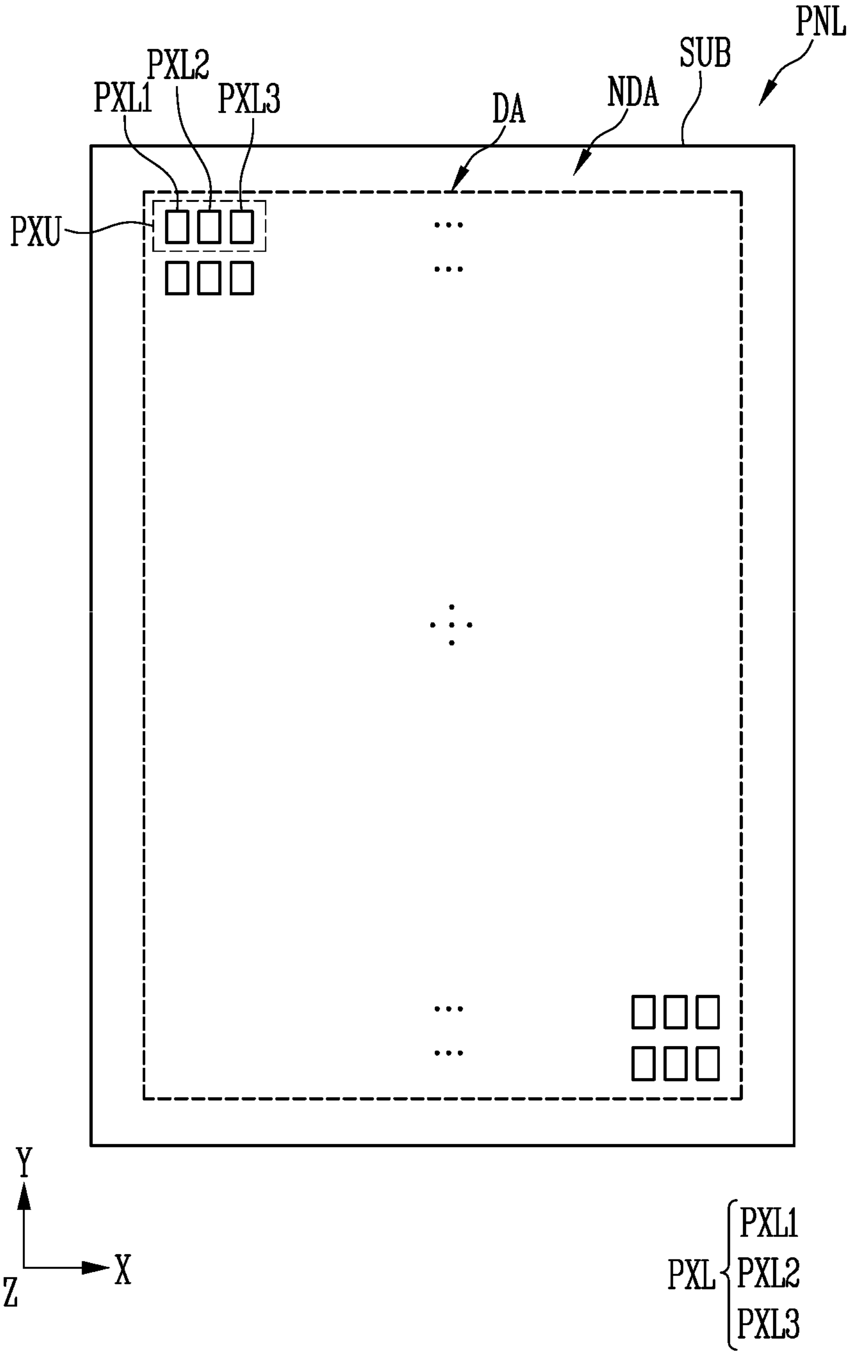
FIG. 3 illustrates a top plan view of a display device according to one or more embodiments.

FIG. 3 illustrates a top plan view of a display device according to one or more embodiments.

FIG. 3 illustrates a display device, for example, a display panel PNL provided in the display device as an example of an electronic device that may use the light emitting element LD described in the embodiments of FIG. 1 and FIG. 2 as a light source.

Each pixel unit PXU of the display panel PNL and each pixel configuring the same may include at least one light emitting element LD. For better understanding and ease of description, FIG. 3 briefly illustrates the structure of the display panel PNL based on a display area DA. However, in one or more embodiments, at least one driving circuit portion (for example, at least one of a scan driver and a data driver), wires, and/or pads, may be further located in the display panel PNL.

Referring to FIG. 3, the display panel PNL may include a substrate SUB and the pixel unit PXU located on the substrate SUB. The pixel unit PXU may include first pixels PXL1, second pixels PXL2, and/or third pixels PXL3. Hereinafter, when arbitrarily referring to one or more pixels among the first pixels PXL1, the second pixels PXL2, and the third pixels PXL3, or when comprehensively referring to two or more types of pixels, they will be referred to as a "pixel PXL" or "pixels PXL."

The substrate SUB configures a base member of the display panel PNL, and may be a rigid or flexible substrate or film. For example, the substrate SUB may be formed as a rigid substrate made of glass or tempered glass and as a flexible substrate made of a plastic or metallic material (or a thin film), but the material and/or physical properties of the substrate SUB are not particularly limited.

The display panel PNL and the substrate SUB for forming the display panel include a display area DA for displaying an image and a non-display area NDA excluding the display area DA. In some embodiments, the non-display area NDA may be around the edge or periphery of the display area DA. The pixels PXL may be located in the display area DA. In the non-display area NDA, various wires connected to the pixels PXL of the display area DA, pads, and/or internal circuit parts may be located. The pixels PXL may be regularly arranged according to a stripe or PENTILE™ arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the pixels PXL is not limited thereto, and the pixels PXL may be arranged in the display area DA in various structures and/or methods.

In one or more embodiments, two or more types of pixels PXL emitting light of different colors may be located in the display area DA. For example, in the display area DA, the first pixels PXL1 emitting light of the first color, the second pixels PXL2 emitting light of the second color, and the third pixels PXL3 emitting light of the third color may be arranged. At least one of the first to third pixels PXL1, PXL2, and PXL3 that are adjacent to each other may form one pixel unit PXU that may emit light of various colors. For example, each of the first to third pixels PXL1, PXL2, and PXL3 may be a sub-pixel that emits light of a desired color (e.g., a set or predetermined color). According to one or more embodiments, the first pixel PXL1 may be a red pixel that emits red light, the second pixel PXL2 may be a green pixel that emits green light, and the third pixel PXL3 may be a blue pixel that emits blue light, but the present disclosure is not limited thereto.

In one or more embodiments, the first pixel PXL1, the second pixel PXL2, and the third pixel PXL3 are provided with light emitting elements of the same color, and include color conversion layers and/or color filters of different colors located on respective light emitting elements, so that they may emit light of the first color, the second color, and the third color, respectively. In one or more embodiments, the first pixel PXL1, the second pixel PXL2, and the third pixel PXL3 are each provided with a first color light emitting element, a second color light emitting element, and a third color light emitting element as a light source, respectively, so that they respectively emit light of the first color, the second color, and the third color. However, the color, type, and/or number of pixels PXL configuring each pixel unit PXU are not particularly limited. That is, the color of light emitted by each pixel PXL may be variously changed.

The pixel PXL may include at least one light source driven by a suitable control signal (e.g. a set or predetermined control signal) (for example, a scan signal and a data signal) and/or a power source (e.g., a set or predetermined power source) (for example, a first power source and a second power source). In one or more embodiments, the light source may include at least one light emitting element LD according to one of the embodiments of FIG. 1 and FIG. 2, for example, ultra-small cylindrical shape light emitting elements LD having a size as small as nanometer scale to micrometer scale. However, the present disclosure is not limited thereto, and various types of light emitting elements LD may be used as a light source of the pixel PXL.

In one or more embodiments, each pixel PXL may be configured as an active pixel. However, the type, structure, and/or driving method of pixels PXL that may be applied to the display device are not particularly limited. For example, each pixel PXL may be configured as a pixel of a passive or active light emitting display device of various structures and/or driving methods.

Figure 4:
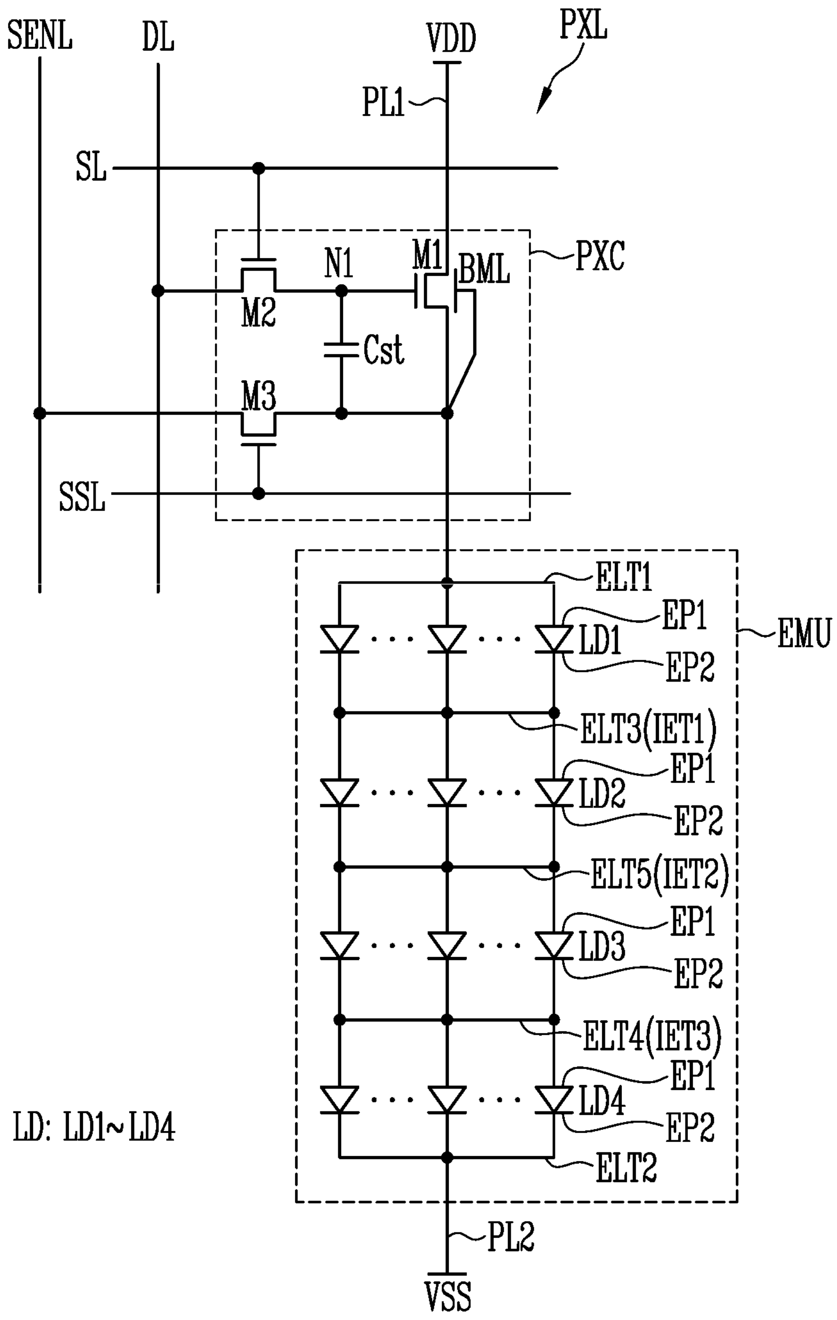
FIG. 4 illustrates a circuit diagram of a pixel according to one or more embodiments.

FIG. 4 illustrates a circuit diagram of a pixel according to one or more embodiments.

In one or more embodiments, the pixel PXL shown in FIG. 4 may be one of the first pixel PXL1, the second pixel PXL2, and the third pixel PXL3 provided in the display panel PNL of FIG. 3. The first pixel PXL1, the second pixel PXL2, and the third pixel PXL3 may have substantially the same or similar structure.

Referring to FIG. 4, the pixel PXL may further include a light emitting part EMU for generating light at luminance corresponding to a data signal, and a pixel circuit PXC for driving a light emitting part EMU.

The pixel circuit PXC may be connected between a first power source VDD and the light emitting part EMU. In addition, the pixel circuit PXC may be connected to a scan line SL and a data line DL of the pixel PXL to control an operation of the light emitting part EMU in response to a scan signal and a data signal supplied from the scan line SL and the data line DL. The pixel circuit PXC may be further selectively connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first connecting electrode ELT1. A gate electrode of the first transistor M1 may be connected to a first node N1. The first transistor M1 may control a driving current supplied to the light emitting part EMU in response to a voltage of the first node N1. That is, the first transistor M1 may be a driving transistor that controls a driving current of the pixel PXL.

In one or more embodiments, the first transistor M1 may optionally include a bottom metal layer BML (also referred to as a "lower electrode," "back gate electrode," or "lower light blocking layer"). The gate electrode of the first transistor M1 and the bottom metal layer BML may overlap each other with an insulating layer interposed therebetween. In one or more embodiments, the bottom metal layer BML may be connected to one electrode of the first transistor M1, for example, a source electrode or a drain electrode thereof.

When the first transistor M1 includes the bottom metal layer BML, by applying a back-biasing voltage to the bottom metal layer BML of the first transistor M1 when the pixel PXL is driven, a back-biasing technique (or a sync technique) of moving a threshold voltage of the first transistor M1 in a negative or positive direction may be applied. For example, by connecting the bottom metal layer BML to the source electrode of the first transistor M1 to apply a source-sync technique, the threshold voltage of the first transistor M1 may be moved in the negative or positive direction. In addition, when the bottom metal layer BML is located under a semiconductor pattern forming a channel of the first transistor M1, the bottom metal layer BML may serve as a light blocking pattern to stabilize an operating characteristic of the first transistor M1. However, the function and/or utilization method of the bottom metal layer BML is not limited thereto.

The second transistor M2 may be connected between the data line DL and the first node N1. A gate electrode of the second transistor M2 may be connected to a scan line SL. When a scan signal of a gate-on voltage (for example, a high level voltage) is supplied from the scan line SL, the second transistor M2 may be turned on to connect the data line DL and the first node N1.

For each frame period, a data signal of the corresponding frame is supplied to the data line DL, and the data signal be transmitted to the first node N1 through the turned-on second transistor M2 during a period in which the scan signal of the gate-on voltage is supplied. That is, the second transistor M2 may be a switching transistor for transmitting each data signal to the inside of the pixel PXL.

One electrode of the storage capacitor Cst may be connected to the first node N1, and the other electrode thereof may be connected to a second electrode (e.g., the source electrode) of the first transistor M1. The storage capacitor Cst may be charged with a voltage (or may hold a charge) corresponding to the data signal supplied to the first node N1 during each frame period.

The third transistor M3 may be connected between the first connecting electrode ELT1 (or the second electrode of the first transistor M1) and the sensing line SENL. A gate electrode of the third transistor M3 may be connected to the sensing signal line SSL. The third transistor M3 may transmit a voltage applied to the first connecting electrode ELT1 to the sensing line SENL according to a sensing signal supplied to the sensing signal line SSL. The voltage transmitted through the sensing line SENL may be provided to an external circuit (for example, a timing controller), and the external circuit may detect characteristic information (for example, a threshold voltage of the first transistor M1) of each pixel PXL based on the supplied voltage. The detected characteristic information may be used to convert image data so that a characteristic deviation between the pixels PXL is compensated.

Although in FIG. 4, all the transistors included in the pixel circuit PXC are illustrated as N-type transistors, the present disclosure is not limited thereto. For example, at least one of the first, second, and third transistors M1, M2, and M3 may be changed to a P-type transistor.

In addition, the structure and driving method of the pixel PXL may be variously changed. For example, the pixel circuit PXC may be configured as a pixel circuit having various structures and/or driving methods in addition to that of the embodiments corresponding to FIG. 4.

For example, the pixel circuit PXC may not include the third transistor M3. In addition, the pixel circuit PXC may further include other circuit elements such as a compensation transistor for compensating for a threshold voltage of the first transistor M1, an initialization transistor for initializing the voltage of the first node N1 and/or of the first connecting electrode ELT1, a light emission control transistor for controlling a period in which a driving current is supplied to the light emitting part EMU, and/or a boosting capacitor for boosting the voltage of the first node N1.

The light emitting part EMU may include at least one light emitting element LD connected between the first power source VDD and a second power source VSS, for example, a plurality of light emitting elements LD connected between the first power source VDD and a second power source VSS.

For example, the light emitting part EMU may include the first connecting electrode ELT1 connected to the first power source VDD through the pixel circuit PXC and a first power line PL1, a second connecting electrode ELT2 connected to the second power source VSS through a second power line PL2, and a plurality of light emitting elements LD connected between the first and second connecting electrodes ELT1 and ELT2.

The first and second power sources VDD and VSS may have different potentials so that the light emitting elements LD may emit light. For example, the first power source VDD may be set as a high potential power source, and the second power source VSS may be set as a low potential power source.

In one or more embodiments, the light emitting part EMU may include at least one serial stage. Each serial stage may include a pair of electrodes (for example, two electrodes) and at least one light emitting element LD connected in a forward direction between the pair of electrodes. Here, the number of serial stages forming the light emitting part EMU and the number of light emitting elements LD forming each serial stage are not particularly limited. For example, the number of the light emitting elements LD configuring respective serial stages may be the same as or different from each other, but the number of the light emitting elements LD is not particularly limited.

For example, the light emitting part EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include the first connecting electrode ELT1, the third connecting electrode ELT3, and at least one first light emitting element LD1 connected between the first and third connecting electrodes ELT1 and ELT3. Each first light emitting element LD1 may be connected in a forward direction between the first and third connecting electrodes ELT1 and ELT3. For example, the first end portion EP1 of the first light emitting element LD1 may be connected to the first connecting electrode ELT1, and the second end portion EP2 of the first light emitting element LD1 may be connected to the third connecting electrode ELT3.

The second serial stage may include the third connecting electrode ELT3, the fifth connecting electrode ELT5, and at least one second light emitting element LD2 connected between the third and fifth connecting electrodes ELT3 and ELT5. Each second light emitting element LD2 may be connected in a forward direction between the third and fifth connecting electrodes ELT3 and ELT5. For example, the first end portion EP1 of the second light emitting element LD2 may be connected to the third connecting electrode ELT3, and the second end portion EP2 of the second light emitting element LD2 may be connected to fifth connecting electrode ELT5.

The third serial stage may include the fifth connecting electrode ELT5, the fourth connecting electrode ELT4, and at least one third light emitting element LD3 connected between the fourth and fifth connecting electrodes ELT4 and ELT5. Each third light emitting element LD3 may be connected in a forward direction between the fifth and fourth connecting electrodes ELT5 and ELT4. For example, the first end portion EP1 of the third light emitting element LD3 may be connected to the fifth connecting electrode ELT5, and the second end portion EP2 of the third light emitting element LD3 may be connected to fourth connecting electrode ELT4.

The fourth serial stage may include the fourth connecting electrode ELT4, the second connecting electrode ELT2, and at least one fourth light emitting element LD4 connected between the second and fourth connecting electrodes ELT2 and ELT4. Each fourth light emitting element LD4 may be connected in a forward direction between the fourth and second connecting electrodes ELT4 and ELT2. For example, the first end portion EP1 of the fourth light emitting element LD4 may be connected to the fourth connecting electrode ELT4, and the second end portion EP2 of the fourth light emitting element LD4 may be connected to the second connecting electrode ELT2.

A first electrode of the light emitting part EMU, for example, the first connecting electrode ELT1 may be an anode electrode of the light emitting part EMU. A last electrode of the light emitting part EMU, for example, the second connecting electrode ELT2 may be a cathode electrode of the light emitting part EMU.

The remaining electrodes of the light emitting part EMU, for example, the third connecting electrode ELT3, the fourth connecting electrode ELT4, and/or the fifth connecting electrode ELT5, may be configured as intermediate electrodes. For example, the third connecting electrode ELT3 may be configured as the first intermediate electrode IET1, the fifth connecting electrode ELT5 may be configured as the second intermediate electrode IET2, and the fourth connecting electrode ELT4 may be configured the third intermediate electrode IET3.

When the light emitting elements LD are connected in a serial and/or parallel structure, power efficiency may be improved compared with when the same number of light emitting elements LD are connected only in parallel. In addition, in the pixel PXL in which the light emitting elements LD are connected in a serial and/or parallel structure, even if a short circuit defect occurs at some of the serial stages, because a desired luminance (e.g., a set or predetermined luminance) may be displayed through the light emitting elements LD in the remaining serial stages, the possibility of dark spot defects of the pixel PXL may be reduced. However, the present disclosure is not limited thereto, and the light emitting part EMU may be configured by connecting the light emitting elements LD only in series or only in parallel.

Each of the light emitting elements LD may include at least one electrode (for example, the first connecting electrode ELT1), the first end portion EP1 (for example, a p-type end portion) connected to the first power source VDD via the pixel circuit PXC and/or the first power line PL1, and the second end portion EP2 (for example, an n-type end portion) connected to the second power source VSS via at least one other electrode (for example, the second connecting electrode ELT2) and the second power line PL2. That is, the light emitting elements LD may be connected in a forward direction between the first power source VDD and the second power source VSS. The light emitting elements LD connected in the forward direction may configure the effective light sources of the light emitting part EMU.

When a driving current is supplied through the corresponding pixel circuit PXC, the light emitting elements LD may emit light with luminance corresponding to the driving current. For example, during each frame period, the pixel circuit PXC may supply a driving current corresponding to a gray value to be displayed in the corresponding frame to the light emitting part EMU. Accordingly, while the light emitting elements LD emit light with luminance corresponding to the driving current, the light emitting part EMU may display the luminance corresponding to the driving current.

Figure 5:
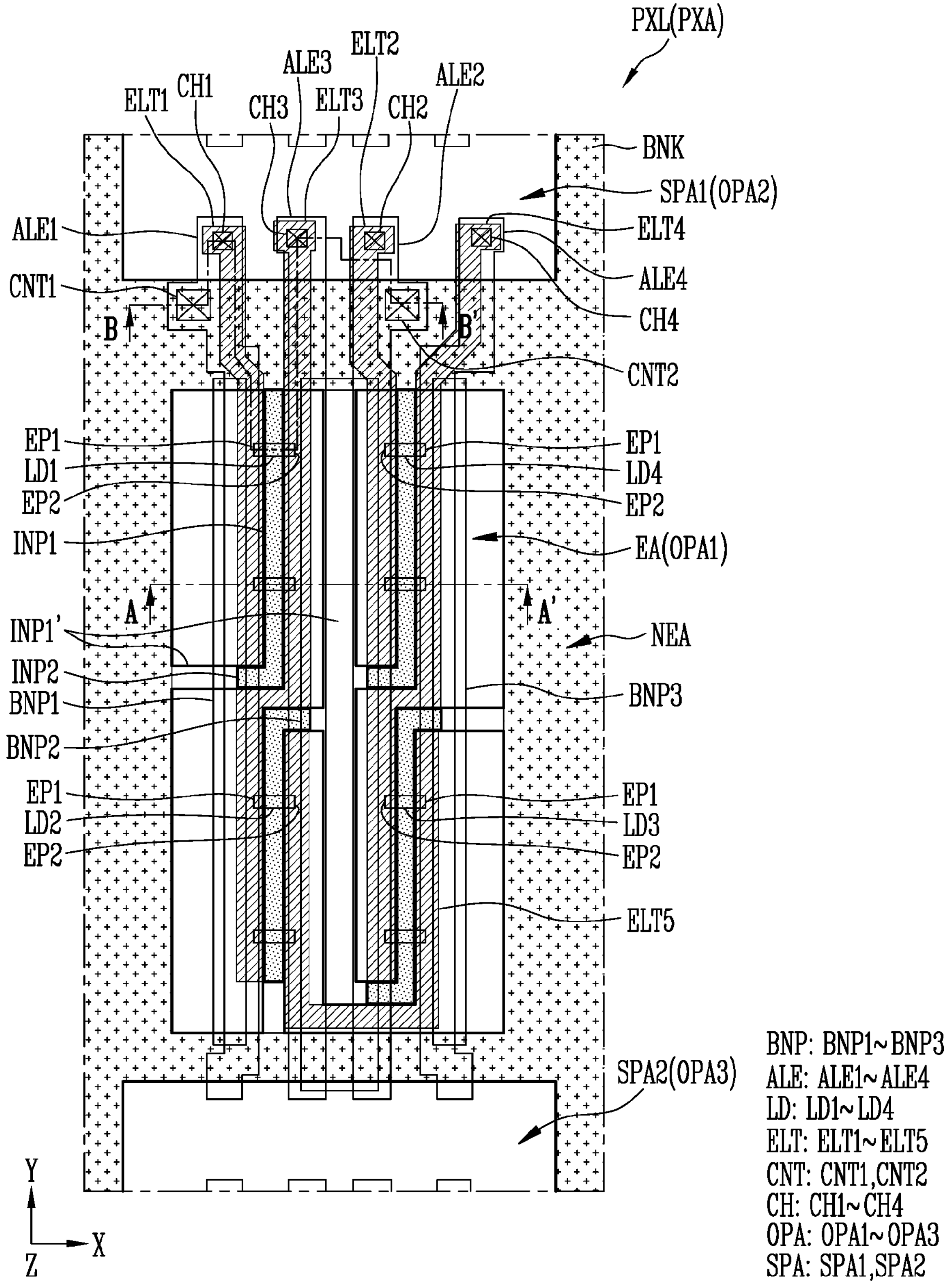
FIG. 5 illustrates a top plan view of a pixel according to one or more embodiments.
Figure 6:
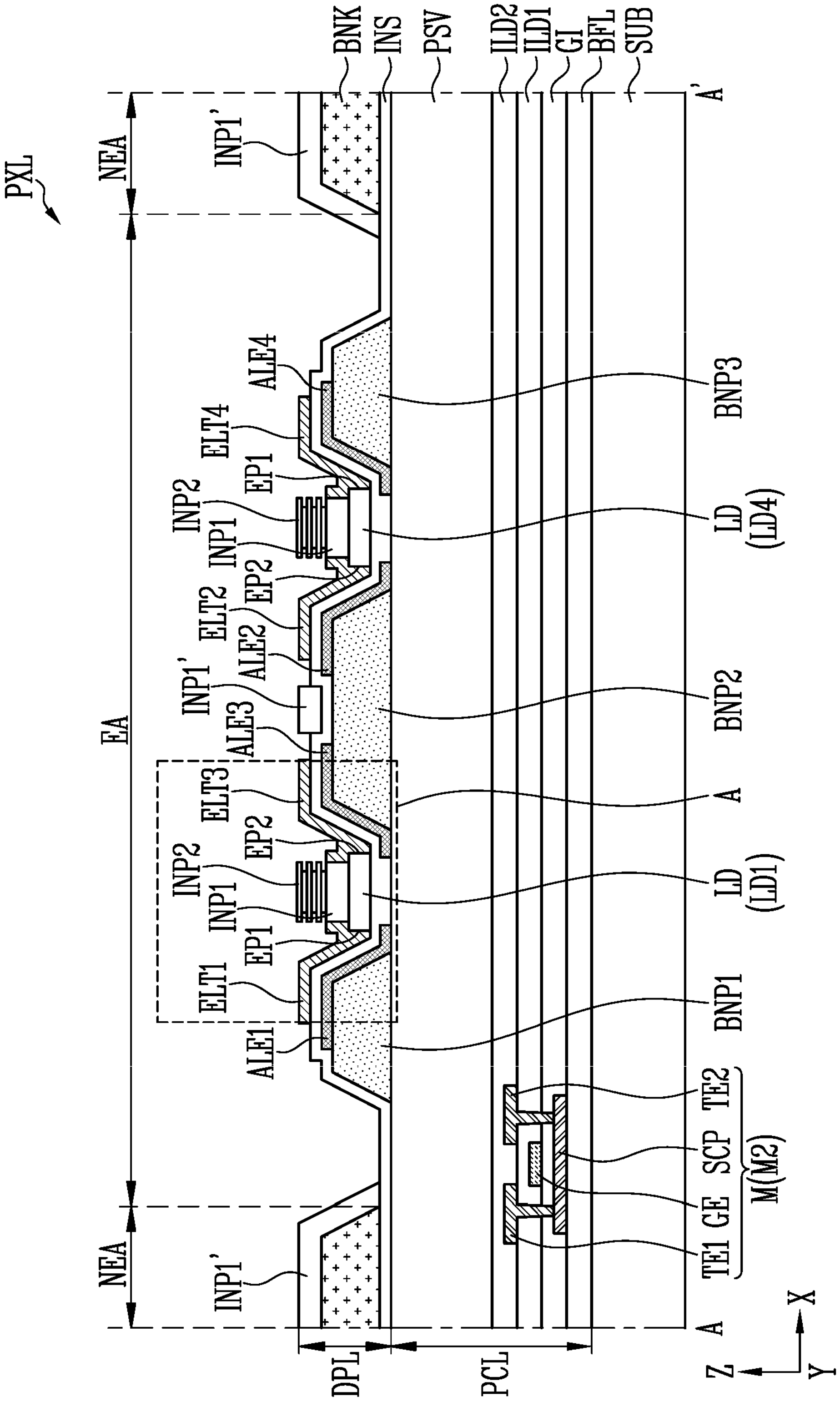
FIG. 6 illustrates a cross-sectional view taken along the line A-A' of FIG. 5.
Figure 7:
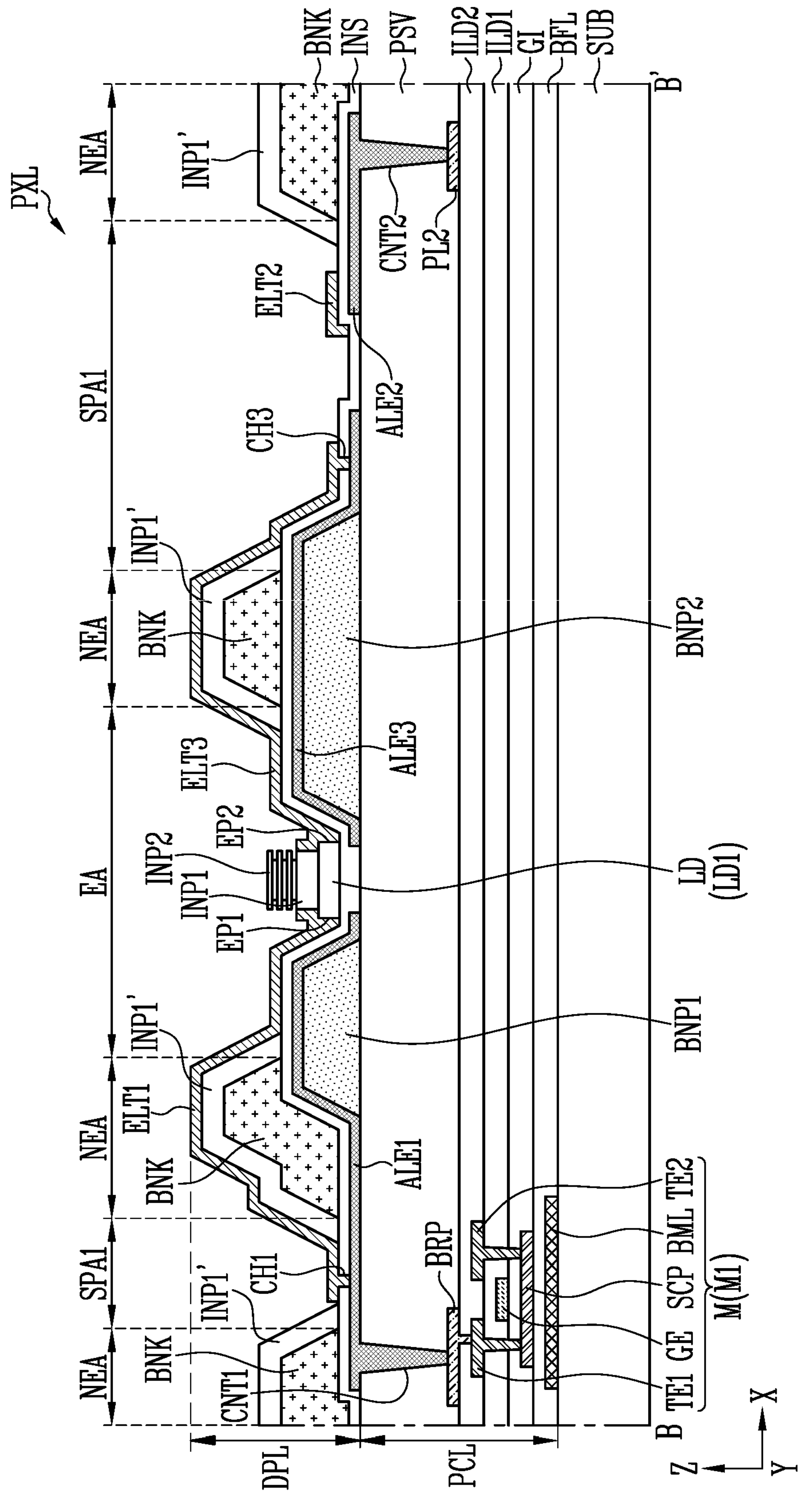
FIG. 7 illustrates a cross-sectional view taken along the line B-B' of FIG. 5.
Figure 8:
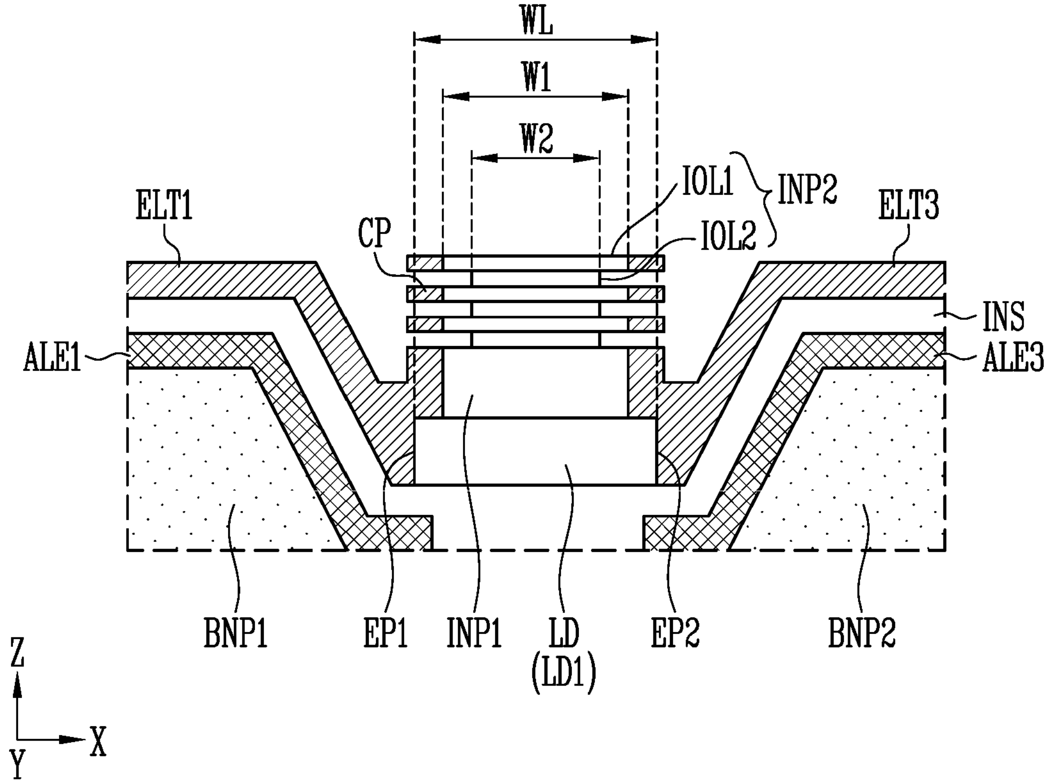
FIG. 8 illustrates an enlarged cross-sectional view of an area "A" of FIG. 6.

FIG. 5 illustrates a top plan view of a pixel according to one or more embodiments. FIG. 6 illustrates a cross-sectional view taken along the line A-A' of FIG. 5. FIG. 7 illustrates a cross-sectional view taken along the line B-B' of FIG. 5. FIG. 8 illustrates an enlarged cross-sectional view of an area "A" of FIG. 6.

As an example, FIG. 5 may be one of the first to third pixels PXL1, PXL2, and PXL3 configuring the pixel unit PXU of FIG. 3, and the first to third pixels PXL1, PXL2, and PXL3 may be substantially the same or similar to each other. In addition, FIG. 5 illustrates one or more embodiments in which each pixel PXL includes the light emitting elements LD located in the four serial stages as shown in FIG. 4, but the number of serial stages of each pixel PXL may be variously changed according to embodiments.

Hereinafter, when arbitrarily referring to one or more light emitting element among first to fourth light emitting elements LD1 to LD4, or comprehensively referring to two or more light emitting elements, it or they will be referred to as a "light emitting element LD" or "light emitting elements LD" will be referred. In addition, when arbitrarily referring to at least one of electrodes including first to fourth electrodes ALE1, ALE2, ALE3, and ALE4, it or they will be referred to as an "electrode ALE" or "electrodes ALE," and when arbitrarily referring to at least one of electrodes including first to fifth connecting electrodes ELT1 to ELT5, it or they will be referred to as an "connecting electrode ELT" or "connecting electrodes ELT."

Referring to FIG. 5, each pixel PXL may include a light emitting area EA, a non-light emitting area NEA, and a separating area SPA. The light emitting area EA may be an area that may emit light by including the light emitting elements LD. The non-light emitting area NEA may be located to be around (e.g., surround) the light emitting area EA. The non-light emitting area NEA may be an area in which a bank BNK that is around (e.g., surrounding) the light emitting area EA is provided. The separating area SPA may be spaced from the light emitting area EA with the non-light emitting area NEA interposed therebetween. The separating area SPA may include a first separating area SPA1 located at one side of the light emitting area EA, and a second separating area SPA2 located at the other side of the light emitting area EA. The separating area SPA may be an area of the remaining pixel areas PXA excluding the light emitting area EA, which is located in an opening OPA of the bank BNK and in which at least one electrode ALE is separated or cut (disconnected).

Each pixel PXL may include patterns BNP, electrodes ALE, light emitting elements LD, first insulating pattern INP1, second insulating pattern INP2, and connecting electrodes ELT.

The patterns BNP may be provided in at least light emitting area EA. The patterns BNP may extend along a second direction (Y-axis direction), and may be spaced from each other along a first direction (X-axis direction).

The patterns BNP (also referred to as "wall patterns" or "bank patterns") may partially overlap at least one electrode (ALE) in a thickness direction of the substrate SUB (Z-axis direction) in at least light emitting area EA. For example, the first pattern BNP1 may be provided under the first electrode ALE1 so as to overlap one area of the first electrode ALE1 in the Z-axis direction, the second pattern BNP2 may be provided under the second and third electrodes ALE2 and ALE3 so as to overlap one area of each of the second and third electrodes ALE2 and ALE3 in the Z-axis direction, and the third pattern BNP3 may be provided under the fourth electrode ALE4 so as to overlap one area of the fourth electrode ALE4 in the Z-axis direction.

As the patterns BNP are provided under one area of each of the electrodes ALE, one area of each of the electrodes ALE in areas in which the patterns BNP are formed may protrude in an upward direction of the pixel PXL, that is, a third direction (e.g., the Z-axis direction). When the patterns BNP and/or electrodes ALE include a reflective material, a reflective wall structure may be formed around the light emitting elements LD. Accordingly, as light emitted from the light emitting elements LD may be directed in an upward direction (for example, a front direction of the display panel PNL including a suitable viewing angle range (e.g., a set or predetermined viewing angle range) of the pixel PXL, light emission efficiency of the pixel PXL may be improved.

The electrodes ALE may be provided in at least light emitting area EA. The electrodes ALE may extend along a second direction (Y-axis direction), and may be spaced from each other in a first direction (X-axis direction). The electrodes ALE may extend from the light emitting area EA through the non-light emitting area NEA to the separating area SPA, and may be separated or cut off in the separating area SPA. For example, each of the first to fourth electrodes ALE1 to ALE4 extends from the light emitting area EA to the first and second separating areas SPA1 and SPA2, and is cut off in the first and second separating areas SPA1 and SPA2, so that it may be separated from the electrodes ALE of an adjacent pixel PXL (e.g., a pixel PXL adjacent in the Y-axis direction). However, the present disclosure is not limited thereto, and at least one of the electrodes ALE may not be cut off in the separating area SPA, and may be integrally connected with one of the electrodes ALE of the adjacent pixel PXL (e.g., a pixel PXL adjacent in the Y-axis direction).

In one or more embodiments, some of the electrodes ALE may be connected to the pixel circuit PXC and/or a suitable power line (e.g., a set or predetermined power line) through a contact part CNT. For example, the first electrode ALE1 may be connected to the pixel circuit PXC and/or the first power line PL1 through a first contact part CNT1, and the second electrode ALE2 may be connected to the second power line PL2 through a second contact part CNT2. The contact part CNT may be provided in the non-light emitting area NEA, but is not limited thereto.

In one or more embodiments, at least one of the electrodes ALE may be connected to at least one of the connecting electrodes ELT through a contact hole CH. For example, the first electrode ALE1 may be electrically connected to the first connecting electrode ELT1 through a first contact hole CH1, and the second electrode ALE2 may be electrically connected to the second connecting electrode ELT2 through a second contact hole CH2. In addition, the third electrode ALE3 may be electrically connected to the third connecting electrode ELT3 through a third contact hole CH3, and the fourth electrode ALE4 may be electrically connected to the fourth connecting electrode ELT4 through a fourth contact hole CH4. The contact holes CH may be provided in the separating area SPA, but are not limited thereto.

Each of the electrodes ALE may be located on at least one pattern BNP. For example, the first electrode ALE1 may be located in one area of the first pattern BNP1, the second and third electrodes ALE2 and ALE3 may be located in different areas of the second pattern BNP2, and the fourth electrode ALE4 may be located in one area of the third pattern BNP3. In one or more embodiments, when the third electrode ALE3 is located between the first and second electrodes ALE1 and ALE2, the third electrode ALE3 may be located at one (or left) area of the second pattern BNP2, and the second electrode ALE2 may be located at the other (or right) area of the second pattern BNP2.

A pair of electrodes ALE adjacent to each other may receive different signals in an alignment step of the light emitting elements LD. For example, when the first electrode ALE1, the third electrode ALE3, the second electrode ALE2, and the fourth electrode ALE4 are sequentially arranged along the first direction (X-axis direction) in the light emitting area EA, the first and third electrodes ALE1 and ALE3 may form a pair to receive different alignment signals, and the second and fourth electrodes ALE2 and ALE4 may form a pair to receive different alignment signals.

In one or more embodiments, the second and third electrodes ALE2 and ALE3 may receive the same signal in the alignment step of the light emitting elements LD. The second and third electrodes ALE2 and ALE3 may be integrally or non-integrally connected to each other in the alignment step of the light emitting elements LD, but are not limited thereto.

Each of the light emitting elements LD may be aligned between a pair of patterns BNP in the light emitting area EA. Each of the light emitting elements LD may be electrically connected between a pair of connecting electrodes ELT, and may have provide an anastomosis connection between the pair of connecting electrodes ELT.

The first light emitting element LD1 may be aligned between the first and second patterns BNP1 and BNP2. The first light emitting element LD1 may be anastomosis electrically connected between the first and third connecting electrodes ELT1 and ELT3. As an example, the first light emitting element LD1 may be aligned at one side (or an upper end) of an area between the first and second patterns BNP1 and BNP2, and the first end portion EP1 of the first light emitting element LD1 may electrically connected to the first connecting electrode ELT1, and the second end portion EP2 of the first light emitting element LD1 may be electrically connected to the third connecting electrode ELT3.

The second light emitting element LD2 may be aligned between the first and second patterns BNP1 and BNP2. The second light emitting element LD2 may be electrically connected between the third and fifth connecting electrodes ELT3 and ELT5. As an example, the second light emitting element LD2 may be aligned at the other side (or a lower end) of an area between the first and second patterns BNP1 and BNP2, and the first end portion EP1 of the second light emitting element LD2 may electrically connected to the third connecting electrode ELT3, and the second end portion EP2 of the second light emitting element LD2 may be electrically connected to the fifth connecting electrode ELT5.

The third light emitting element LD3 may be aligned between the second and third patterns BNP2 and BNP3. The third light emitting element LD3 may be electrically connected between the fourth and fifth connecting electrodes ELT4 and ELT5. As an example, the third light emitting element LD3 may be aligned at the other side (or a lower end) of an area between the second and third patterns BNP2 and BNP3, and the first end portion EP1 of the third light emitting element LD3 may electrically connected to the fifth connecting electrode ELT5, and the second end portion EP2 of the third light emitting element LD3 may be electrically connected to the fourth connecting electrode ELT4.

The fourth light emitting element LD4 may be aligned between the second and third patterns BNP2 and BNP3. The fourth light emitting element LD4 may be electrically connected between the second and fourth connecting electrodes ELT2 and ELT4. As an example, the fourth light emitting element LD4 may be aligned at one side (or an upper end) of an area between the second and third patterns BNP2 and BNP3, and the first end portion EP1 of the fourth light emitting element LD4 may electrically connected to the fourth connecting electrode ELT4, and the second end portion EP2 of the fourth light emitting element LD4 may be electrically connected to the second connecting electrode ELT2.

For example, the first light emitting element LD1 may be located in an upper left area of the light emitting area EA, and the second light emitting element LD2 may be located in a lower left area of the light emitting area EA. The third light emitting element LD3 may be located in a lower right area of the light emitting area EA, and the fourth light emitting element LD4 may be located in an upper right area of the light emitting area EA. However, the arrangement and/or connection structure of the light emitting elements LD may be variously changed depending on the structure of the light emitting part EMU and/or the number of serial stages.

The first insulating pattern INP1 may be located to overlap the light emitting elements LD in the light emitting area EA. For example, the first insulating pattern INP1 may be located to overlap the first light emitting elements LD1 between the first and third connecting electrodes ELT1 and ELT3. In addition, the first insulating pattern INP1 may be located to overlap the second light emitting elements LD2 between the third and fifth connecting electrodes ELT3 and ELT5. Further, the first insulating pattern INP1 may be located to overlap the third light emitting elements LD3 between the fourth and fifth connecting electrodes ELT4 and ELT5. Also, the first insulating pattern INP1 may be located to overlap the fourth light emitting elements LD4 between the second and fourth connecting electrodes ELT2 and ELT4. The first insulating pattern INP1 may extend along the second direction (Y-axis direction) between the connecting electrodes ELT, but is not limited thereto.

In one or more embodiments, the pixel PXL may include an extension INP1' extending from the first insulating pattern INP1. The extension INP1' may be connected to the first insulating pattern INP1 to serve to reduce or prevent the first insulating pattern INP1 from being peeled off. The extension INP1' may extend along the first direction (X-axis direction) from the first insulating pattern INP1. In one or more embodiments, the extension INP1' may additionally extend in the second direction (Y-axis direction) from the first insulating pattern INP1. The extension INP1' may extend to the non-light emitting area NEA to overlap the bank BNK. In addition, the extension INP1' may extend to the connecting electrodes ELT where the light emitting elements LD are not located to extend between the second and third connecting electrodes ELT2 and ELT3 and between the fourth and fifth connecting electrodes ELT4 and ELT5 along the second direction (Y-axis direction), but is not limited thereto.

The second insulating pattern INP2 may be located to overlap the light emitting elements LD and/or the first insulating pattern INP1 in the light emitting area EA. For example, the second insulating pattern INP2 may be located to overlap the first light emitting elements LD1 and/or the first insulating pattern INP1 between the first and third connecting electrodes ELT1 and ELT3. In addition, the second insulating pattern INP2 may be located to overlap the second light emitting elements LD2 and/or the first insulating pattern INP1 between the third and fifth connecting electrodes ELT3 and ELT5. Further, the second insulating pattern INP2 may be located to overlap the third light emitting elements LD3 and/or the first insulating pattern INP1 between the fourth and fifth connecting electrodes ELT4 and ELT5. Also, the second insulating pattern INP2 may be located to overlap the fourth light emitting elements LD4 and/or the first insulating pattern INP1 between the second and fourth connecting electrodes ELT2 and ELT4. The second insulating pattern INP2 may extend along the second direction (Y-axis direction) between the connecting electrodes ELT, but is not limited thereto. The second insulating pattern INP2 may serve to separate (or insulate from each other) the connecting electrodes ELT formed at respective ends of the light emitting elements LD. In this case, because the likelihood of a short circuit between the connecting electrodes ELT may be reduced or prevented by the second insulating pattern INP2, the connecting electrodes ELT may be concurrently formed (e.g., substantially simultaneously formed). That is, it is possible to simplify a manufacturing process of a display device by reducing the number of masks. A detailed description of this will be described later with reference to FIG. 11-FIG. 13.

Each of the connecting electrodes ELT may be at least provided in the light emitting area EA, and may be located to overlap at least one electrode ALE and/or at least one light emitting element LD in the Z-axis direction. For example, each of the electrodes ELT may be formed on the electrodes ALE and/or the light emitting elements LD so as to overlap the electrodes ALE and/or the light emitting elements LD to be electrically connected to the light emitting elements LD.

The first connecting electrode ELT1 may be located on the first area (for example, the upper area) of the first electrode ALE1 and the first end portions EP1 of the first light emitting elements LD1 to be electrically connected to the first end portions EP1 of the first light emitting elements LD1.

The second connecting electrode ELT2 may be located on the first area (for example, the upper area) of the second electrode ALE2 and the second end portions EP2 of the fourth light emitting elements LD4 to be electrically connected to the second end portions EP2 of the fourth light emitting elements LD4. In addition, the second connecting electrode ELT2 may be electrically connected to the first, second, and third light emitting elements LD1, LD2, and LD3 via at least one other electrode ELT and/or light emitting element LD. For example, the second connecting electrode ELT2 may be electrically connected to the second end portions EP2 of the first light emitting elements LD1 via the third connecting electrode ELT3, the second light emitting element LD2, the fifth connecting electrode ELT5, the third light emitting element LD3, the fourth connecting electrode ELT4, and the fourth light emitting element LD4.

The third connecting electrode ELT3 may be located on the first area (for example, the upper area) of the third electrode ALE3 and the second end portions EP2 of the first light emitting elements LD1 to be electrically connected to the second end portions EP2 of the first light emitting elements LD1. In addition, the third connecting electrode ELT3 may be located on the second area (for example, the lower area) of the first electrode ALE1 and may be electrically connected to the first end portions EP1 of the second light emitting elements LD2. For example, the third connecting electrode ELT3 may connect the second end portions EP2 of the first light emitting elements LD1 and the first end portions EP1 of the second light emitting elements LD2 in the light emitting area EA. For this, the third connecting electrode ELT3 may have a curved shape. For example, the third connecting electrode ELT3 may have a curved or bent structure at a boundary between an area in which at least one first light emitting element LD1 is arranged and an area in which at least one second light emitting element LD2 is arranged.

In addition, the third connecting electrode ELT3 may be located between the first and second connecting electrodes ELT1 and ELT2, and may be electrically connected between the first and second connecting electrodes ELT1 and ELT2 through the light emitting elements LD. For example, the third connecting electrode ELT3 may be connected to the first connecting electrode ELT1 through at least one first light emitting element LD1, and may be connected to the second connecting electrode ELT2 through at least one of the second, third, and/or fourth light emitting elements LD2, LD3, and/or LD4 and fifth and fourth connecting electrodes ELT5 and ELT4.

The fourth connecting electrode ELT4 may be located on the second area (for example, the lower area) of the second electrode ALE2 and the second end portions EP2 of the third light emitting elements LD3 to be electrically connected to the second end portions EP2 of the third light emitting elements LD3. In addition, the fourth connecting electrode ELT4 may be located on the second area (for example, the upper area) of the fourth electrode ALE4 and the first end portions EP1 of the fourth light emitting elements LD4 to be electrically connected to the first end portions EP1 of the fourth light emitting elements LD4. For example, the fourth connecting electrode ELT4 may connect the second end portions EP2 of the third light emitting elements LD3 and the first end portions EP1 of the fourth light emitting elements LD4 in the light emitting area EA. For this, the fourth connecting electrode ELT4 may have a curved shape. For example, the fourth connecting electrode ELT4 may have a curved or bent structure at a boundary between an area in which at least one third light emitting element LD3 is arranged and an area in which at least one fourth light emitting element LD4 is arranged.

In addition, the fourth connecting electrode ELT4 may be electrically connected between the first and second connecting electrodes ELT1 and ELT2 through the light emitting elements LD. For example, the fourth connecting electrode ELT4 may be connected to the first connecting electrode ELT1 through at least one of the first, second, and/or third light emitting elements LD1, LD2, and LD3, and the fifth and third connecting electrodes ELT5 and ELT3, and may be connected to the second connecting electrode ELT2 through at least one fourth light emitting element LD4.

The fifth connecting electrode ELT5 may be located on the second area (for example, the lower area) of the third electrode ALE3 and the second end portions EP2 of the second light emitting elements LD2 to be electrically connected to the second end portions EP2 of the second light emitting elements LD2. In addition, the fifth connecting electrode ELT5 may be located on the second area (for example, the lower area) of the fourth electrode ALE4 and the first end portions EP1 of the third light emitting elements LD3 to be electrically connected to the first end portions EP1 of the third light emitting elements LD3. For example, the fifth connecting electrode ELT5 may connect the second end portions EP2 of the second light emitting elements LD2 and the first end portions EP1 of the third light emitting elements LD3 in the light emitting area EA. For this, the fifth connecting electrode ELT5 may have a curved shape. For example, the fifth connecting electrode ELT5 may have a curved or bent structure at or around a boundary between an area in which at least one second light emitting element LD2 is arranged and an area in which at least one third light emitting element LD3 is arranged. In one or more embodiments, the fifth connecting electrode ELT5 does not extend to the separating area SPA and may be formed only inside the light emitting area EA, but is not limited necessarily thereto.

In addition, the fifth connecting electrode ELT5 may be electrically connected between the first and second connecting electrodes ELT1 and ELT2 through the light emitting elements LD. For example, the fifth connecting electrode ELT5 may be electrically connected to the first connecting electrode ELT1 through at least one of the first and second light emitting elements LD1 and LD2 and third connecting electrode ELT3, and may be electrically connected to the second connecting electrode ELT2 through at least one of the third and/or fourth light emitting elements LD3 and/or LD4 and fourth connecting electrode ELT4.

In one or more embodiments, each of the connecting electrodes ELT may extend from the light emitting area EA through the non-light emitting area NEA to the separating area SPA, and may be electrically connected to at least one electrode ALE through a contact hole CH in the separating area SPA. For example, the first to fourth connecting electrodes ELT1 to ELT4 may extend from the light emitting area EA to the first separating area SPA1. In the first separating area SPA1, the first connecting electrode ELT1 may be electrically connected to the first electrode ALE1 through the first contact hole CH1, and the second connecting electrode ELT2 may be electrically connected to the second electrode ALE2 through the second contact hole CH2. In addition, in the first separating area SPA1, the third connecting electrode ELT3 may be electrically connected to the third electrode ALE3 through the third contact hole CH3, and the fourth connecting electrode ELT4 may be electrically connected to the fourth electrode ALE4 through the fourth contact hole CH4.

Although FIG. 5 illustrates embodiments in which all of the first to fourth connecting electrodes ELT1 to ELT4 extend to the first separating area SPA1, the present disclosure is not limited thereto. For example, some or all of the first to fourth connecting electrodes ELT1 to ELT4 may extend to the second separating area SPA2 to be electrically connected to a corresponding electrode ALE in the second separating area SPA2.

As such, when the contact holes CH are located in the separating area SPA, the contact holes CH may be formed in an area excluding the light emitting area EA in which the light emitting elements LD are supplied and aligned, so that in the alignment step of the light emitting elements LD, a more uniform electric field may be formed in the light emitting area EA, and the likelihood of separation of the light emitting elements LD may be reduced or prevented.

According to the above-described manner, the light emitting elements LD arranged between the electrodes ALE and/or the patterns BNP, which may overlap the connecting electrodes ELT, may be connected in a desired connection pattern (e.g., series and/or parallel connection) by using the electrodes ELT. For example, the first light emitting elements LD1, the second light emitting elements LD2, the third light emitting elements LD3, and the fourth light emitting elements LD4 may be sequentially connected in series by using the connecting electrodes ELT.

The bank BNK may be provided in the non-light emitting area NEA to be around (or surround) the light emitting area EA and the separating area SPA. In addition, the bank BNK may be provided at an outer portion of each pixel area PXA and/or between adjacent pixel areas PXA so as to include a plurality of openings OPA corresponding to the light emitting area EA and the separating area SPA of the pixel PXL. For example, the bank BNK may include a first opening OPA1 corresponding to the light emitting area EA, a second opening OPA2 corresponding to the first separating area SPA1, and a third opening OPA3 corresponding to the second separating area SPA2. That is, the bank BNK may include a first opening OPA1 defining the light emitting area EA, a second opening OPA2 defining the first separating area SPA1, and a third opening OPA3 defining the second separating area SPA2.

The bank BNK may form a dam structure that defines the light emitting area EA in which the light emitting elements LD may be supplied in the step of supplying the light emitting elements LD to each pixel PXL. For example, the light emitting area EA is partitioned by the bank BNK, so that a desired type and/or amount of light emitting element ink may be supplied into the light emitting area EA.

The bank BNK may include at least one light blocking and/or reflective material. Accordingly, light leakage between adjacent pixels PXL may be reduced or prevented. For example, the bank BNK may include at least one of a black matrix material and/or a color filter material. For example, the bank BNK may be formed in a black opaque pattern that may block transmission of light. In one or more embodiments, a reflective film may be formed on a surface (for example, a side wall) of the bank BNK to increase the light efficiency of each pixel PXL.

Hereinafter, a cross-sectional structure of each pixel PXL will be described in detail with reference to FIG. 6-FIG. 8, based on the light emitting element LD. FIG. 6 and FIG. 7 illustrate the second transistor M2 among various circuit elements forming the pixel circuit PXC, and FIG. 7 illustrates the first transistor M1. Hereinafter, when it is not necessary to distinguish and specify the first transistor M1 and the second transistor M2, they will be comprehensively referred to as the "transistor M." However, structures of the transistors M and/or a position of each layer thereof are not limited to the embodiments shown in FIG. 6 and FIG. 7, and may be variously changed according to embodiments.

Referring to FIG. 6 and FIG. 7, the pixels PXL according to one or more embodiments and the display panel PNL including the pixels PXL may include a circuit layer PCL and a display layer DPL that are located on one surface of a substrate SUB.

Circuit elements (for example, the transistors M and the storage capacitor Cst) configuring the pixel circuit PXC of the corresponding pixel PXL and various wires connected to the circuit elements may be located in the circuit layer PCL. The electrodes ALE, the light emitting elements LD, and/or the connecting electrodes ELT that configure the light emitting part EMU of the corresponding pixel PXL may be located in the display layer DPL.

For example, the substrate SUB configures a base member, and may be a rigid or flexible substrate or film. For example, the substrate SUB may be a hard substrate made of glass or tempered glass, a flexible substrate (or a thin film) made of a plastic or metallic material, or at least one layered insulating layer. The material and/or physical properties of the substrate SUB are not particularly limited. In one or more embodiments, the substrate SUB may be substantially transparent. Here, "substantially transparent" may mean that light may be transmitted at a desired transmittance (e.g., a set or predetermined transmittance) or more. In one or more embodiments, the substrate SUB may be translucent or opaque. In addition, the substrate SUB may include a reflective material according to one or more embodiments.

The transistor M may be located on the substrate SUB. The transistor M includes a semiconductor pattern SCP, a gate electrode GE, and first and second transistor electrodes TE1 and TE2, and may selectively further include a bottom metal layer BML.

The bottom metal layer BML may be located on the substrate SUB. The bottom metal layer BML may overlap the gate electrode GE and/or the semiconductor pattern SCP of at least one transistor M (for example, the first transistor M1) in the Z-axis direction.

A buffer layer BFL may be located on the bottom metal layer BML and the substrate SUB. The buffer layer BFL may reduce or prevent impurities diffusing into each circuit element. The buffer layer BFL may be formed as a single layer, but may also be formed as a multilayer of at least two layers or more. When the buffer layer BFL is formed as the multilayer, respective layers may be made of the same material or different materials.

The semiconductor pattern SCP may be located on the buffer layer BFL. For example, the semiconductor pattern SCP may include a first area contacting the first transistor electrode TE1, a second area contacting the second transistor electrode TE2, and a channel area located between the first and second areas that overlaps the gate electrode GE of the transistor M (for example, the first transistor M1) in the Z-axis direction. In one or more embodiments, one of the first and second areas may be a source area, and the other one may be a drain area.

In one or more embodiments, the semiconductor pattern SCP may be made of polysilicon, amorphous silicon, an oxide semiconductor, or the like. In addition, the channel area of the semiconductor pattern SCP may be an intrinsic semiconductor as a semiconductor pattern that is not doped with impurities, and each of the first and second areas of the semiconductor pattern SCP may be a semiconductor doped with suitable impurities (e.g., a set or predetermined impurities).

A gate insulating layer GI may be located on the semiconductor pattern SCP and the buffer layer BFL. For example, the gate insulating layer GI may be located between the semiconductor pattern SCP and the gate electrode GE. The gate insulating layer GI may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The gate electrode GE may be located on the gate insulating layer GI. The gate electrode GE may be located to overlap the semiconductor pattern SCP in the third direction (Z-axis direction) on the gate insulating layer GI.

A first interlayer insulating layer ILD1 may be located on the gate electrode GE and the gate insulating layer GI. For example, the first interlayer insulating layer ILD1 may be located between the gate electrode GE and the first and second transistor electrodes TE1 and TE2. The first interlayer insulating layer ILD1 may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The first and second transistor electrodes TE1 and TE2 may be located on the first interlayer insulating layer ILD1. The first and second transistor electrodes TE1 and TE2 may be located to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to a first area of the semiconductor pattern SCP through a contact hole penetrating the first interlayer insulating layer ILD1 and the gate insulating layer GI. The second transistor electrode TE2 may be electrically connected to a second area of the semiconductor pattern SCP through a contact hole penetrating the first interlayer insulating layer ILD1 and the gate insulating layer GI. In one or more embodiments, one of the first and second transistor electrodes TE1 and TE2 may be a source electrode, and the other one may be a drain electrode.

A second interlayer insulating layer ILD2 may be located on the first and second electrodes TE1 and TE2 and the first interlayer insulating layer ILD1. The second interlayer insulating layer ILD2 may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

A bridge pattern BRP and/or the second power line PL2 may be located on the second interlayer insulating layer ILD2. The bridge pattern BRP may be electrically connected to the first transistor electrode TE1 through a contact hole penetrating the second interlayer insulating layer ILD2. The bridge pattern BRP and the second power line PL2 may be formed of the same conductive layer. That is, the bridge pattern BRP and the second power line PL2 may be concurrently formed (e.g., substantially simultaneously formed) in the same process, but are not limited thereto.

The passivation layer PSV may be located on circuit elements including the transistors M. The passivation layer PSV may be made of an organic material in order to flatten a lower step thereof. For example, the passivation layer PSV may include an organic material such as an acrylates resin, an epoxy resin, a phenolic resin, a polyamides resin, a polyimides rein, a polyesters resin, a polyphenylenesulfides resin, or a benzocyclobutene (BCB). However, it is not necessarily limited thereto, and the passivation layer PSV may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The display layer DPL may be located on the passivation layer PSV of the circuit layer PCL. The display layer DPL may include patterns BNP, electrodes ALE, light emitting elements LD, first insulating pattern INP1, second insulating pattern INP2, and connecting electrodes ELT.

The patterns BNP may be located on the passivation layer PSV. The patterns BNP may have various shapes according to embodiments. In one or more embodiments, the patterns BNP may have a shape protruding in the third direction (Z-axis direction) on the substrate SUB. In addition, the patterns BNP may be formed to have an inclined surface inclined at a suitable angle (e.g., a set or predetermined angle) with respect to the substrate SUB. However, the present disclosure is not necessarily limited thereto, and the patterns BNP may have a side wall having a curved surface or a step shape. For example, the patterns BNP may have a cross-section of a semicircle or semi-ellipse shape.

Electrodes and insulating layers located at an upper portion of the patterns BNP may have a shape corresponding to the patterns BNP. As an example, the electrodes ALE located on the patterns BNP may include an inclined surface or a curved surface having a shape corresponding to the shape of the patterns BNP. Accordingly, the patterns BNP, along with the electrodes ALE provided thereon, may function as a reflective member that guides the light emitted from the light emitting elements LD in a front direction of the pixel PXL (Z-axis direction) to improve the light emitting efficiency of the display panel PNL.

The patterns BNP may include at least one organic material and/or inorganic material. For example, the patterns BNP may include an organic material such as an acrylates resin, an epoxy resin, a phenolic resin, a polyamides resin, a polyimides rein, a polyesters resin, a polyphenylenesulfides resin, or a benzocyclobutene (BCB). However, it is not necessarily limited thereto, and the patterns BNP may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The electrodes ALE may be located on the passivation layer PSV and the patterns BNP. The electrodes ALE may be located to be spaced apart each other in the light emitting area EA. As described above, the electrodes ALE may receive an alignment signal in the alignment step of the light emitting elements LD. Accordingly, an electric field is formed between the electrodes ALE so that the light emitting elements LD supplied to each pixel PXL may be aligned between the electrodes ALE.

In one or more embodiments, each of the electrodes ALE may have a pattern separated for each pixel PXL, or may have a pattern commonly connected to adjacent pixels PXL. For example, each of the first to fourth electrodes ALE1 to ALE4 may have an independent pattern with both ends cut off in the separating area SPA located at the outer periphery of the corresponding pixel area PXA. Alternatively, at least one electrode (for example, the first electrode ALE1) may have an independent pattern of which both ends are cut in the separating area SPA, and at least one other electrode (for example, the second electrode ALE2) may extend in the first direction (X-axis direction) or the second direction (Y-axis direction) to be integrally connected to an electrode (e.g., a set or predetermined electrode) of other adjacent pixels PXL (for example, the second electrode ALE2 of the adjacent pixel PXL).

The first electrode ALE1 may be electrically connected to the bridge pattern BRP through the first contact portion CNT1 penetrating the passivation layer PSV, and through this, may be electrically connected to the transistor M. The second electrode ALE2 may be electrically connected to the second power line PL2 through the second contact portion CNT2 penetrating the passivation layer PSV.

Each of the electrodes ALE may include at least one conductive material. For example, each of the electrodes ALE may include at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the same; a conductive oxide such as an indium tin oxide (ITO), an indium zinc oxide (IZO), an indium tin zinc Oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO); and at least one conductive material among conductive polymers such as PEDOT, but are not necessarily limited thereto.

An insulating layer INS may be located on the electrodes ALE. The insulating layer INS may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The bank BNK may be located on the insulating layer INS of the non-light emitting area NEA. For example, the bank BNK may be provided in the non-light emitting area NEA to be around (or surround or partially surround) the light emitting area EA and the separating area SPA.

The bank BNK may be located to overlap the first and/or second contact portions CNT1 and CNT2. For example, the bank BNK may be located to cover the first and second contact portions CNT1 and CNT2. However, the present disclosure is not necessarily limited thereto, and the bank BNK may be located to non-overlap the first and second contact portion CNT1 and CNT2.

In one or more embodiments, the bank BNK may be located to non-overlap the contact holes CH. Accordingly, it is possible to easily connect respective electrodes ALE to respective connecting electrodes ELT after the formation of the bank BNK.

The bank BNK may include at least one organic material and/or inorganic material. For example, the bank BNK may include an organic material such as an acrylates resin, an epoxy resin, a phenolic resin, a polyamides resin, a polyimides rein, a polyesters resin, a polyphenylenesulfides resin, or a benzocyclobutene (BCB). However, it is not necessarily limited thereto, and the bank BNK may be configured as a single layer or multilayer, and may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic materials.

The light emitting elements LD may be located on the insulating layer INS of the light emitting area EA. The light emitting elements LD may be located between the electrodes ALE on the insulating layer INS. The light emitting elements LD may be prepared in a form dispersed in a suitable solution (e.g., a set or predetermined solution, such as ink), and may be supplied to each pixel PXL through an inkjet printing method and the like. For example, the light emitting elements LD may be dispersed in a volatile solvent to be provided in the light emitting area of each pixel PXL. In the process of aligning the light emitting elements LD, when an alignment signal is supplied through the electrodes ALE, as an electric field is formed between the electrodes ALE, the light emitting elements LD may be aligned between the electrodes ALE. After the light emitting elements LD are aligned, the light emitting elements LD may be stably arranged between the electrodes ALE by volatilizing the solvent or eliminating it in other ways.

The first insulating pattern INP1 and the second insulating pattern INP2 may be located on the light emitting elements LD. The first insulating pattern INP1 and the second insulating pattern INP2 will be described in detail with reference to FIG. 8. In FIG. 8, for better understanding and ease of description, the first and second insulating patterns INP1 and INP2 will be described based on the first light emitting element LD1.

Referring to FIG. 8, the first insulating pattern INP1 may be partially located on the light emitting elements LD. The first insulating pattern INP1 is located on the light emitting elements LD, and may expose the first and second end portions EP1 and EP2 of the light emitting elements LD.

The first insulating pattern INP1 may serve to reduce or prevent a residual film from being formed on the first and second end portions EP1 and EP2 of the light emitting elements LD in a process of forming a concavo-convex structure by etching the second insulating pattern INP2, which will be described later. In addition, when the first insulating pattern INP1 is formed on the light emitting elements LD after the alignment of the light emitting elements LD is completed, it is possible to reduce or prevent the likelihood of a light emitting elements LD deviating from an aligned position.

The first insulating pattern INP1 may include at least one inorganic material and/or organic material. For example, the first insulating pattern INP1 may include a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx), and various types of inorganic insulating materials. However, it is not necessarily limited thereto, the first insulating pattern INP1 may include an organic insulating material such as an acrylates resin, an epoxy resin, a phenolic resin, a polyamides resin, a polyimides rein, a polyesters resin, a polyphenylenesulfides resin, or a benzocyclobutene (BCB).

The second insulating pattern INP2 may be located on the first insulating pattern INP1. The second insulating pattern INP2 may be directly located on the first insulating pattern INP1 to contact an upper surface of the first insulating pattern INP1.

The second insulating pattern INP2 may include a plurality of first inorganic layers IOL1 and second inorganic layers IOL2 that are different from each other. The first inorganic layer IOL1 and the second inorganic layer IOL2 may be alternately stacked. The first inorganic layer IOL1 and the second inorganic layer IOL2 may include different inorganic materials. For example, each of the first inorganic layer IOL1 and the second inorganic layer IOL2 may include at least one of a silicon oxide (SiOx), a silicon nitride (SiNx), a silicon oxynitride (SiOxNy), a silicon oxycarbide (SiOxCy), a silicon carbonitride (SiCxNy), an aluminum oxide (AlOx), an aluminum nitride (AlNx), a hafnium oxide (HfOx), a zirconium oxide (ZrOx), a titanium oxide (TiOx), and a tantalum oxide (TaOx), but is not limited thereto.

A width W1 in the first direction (X-axis direction) of the first inorganic layer IOL1 and a width W2 in the first direction (X-axis direction) of the second inorganic layer IOL2 may be different from each other. In one or more embodiments, the width W1 in the first direction (X-axis direction) of the first inorganic layer IOL1 may be larger than the width W2 in the first direction (X-axis direction) of the second inorganic layer IOL2. For example, when the first inorganic layer IOL1 is a silicon oxide (SiOx) and the second inorganic layer IOL2 is a silicon nitride (SiNx), due to a difference in etching selectivity between the first inorganic layer IOL1 and the second inorganic layer IOL2 in the process of forming the second insulating pattern INP2, the width W1 of the first inorganic layer IOL1 in the first direction (X-axis direction) may be larger than the width W2 of the second inorganic layer IOL2 in the first direction (X-axis direction). However, the materials included in the first inorganic layer IOL1 and the second inorganic layer IOL2 are not necessarily limited thereto, and may be variously changed within a range capable of selectively etching the second inorganic layer IOL2. As described above, when the first inorganic layer IOL1 and the second inorganic layer IOL2 having different widths are alternately stacked, a side surface of the second insulating pattern INP2 may have a concavo-convex shape. Accordingly, when the connecting electrodes ELT are formed on the second insulating pattern INP2, the connecting electrodes ELT may be naturally separated from the side surface of the second insulating pattern INP2 due to the concavo-convex shape of the second insulating pattern INP2. That is, even if the connecting electrodes ELT are concurrently formed (e.g., substantially simultaneously formed), the connecting electrodes ELT may be separated by the second insulating pattern INP2, so that the likelihood of a short circuit between the connecting electrodes ELT may be reduced or prevented.

The width W1 in the first direction (X-axis direction) of the first inorganic layer IOL1 and/or the width W2 in the first direction (X-axis direction) of the second inorganic layer IOL2 may be smaller than a width WL in the first direction (X-axis direction) of the light emitting elements LD. In this case, the second insulating pattern INP2 may not overlap the first and second end portions EP1 and EP2 of the light emitting elements LD in the third direction (Z-axis direction). That is, the first and second end portions EP1 and EP2 of the light emitting elements LD may be exposed by the second insulating pattern INP2. Accordingly, the connecting electrodes ELT, which will be described later, may be naturally separated by the second insulating pattern INP2 to be formed on the first and second end portions EP1 and EP2 of the light emitting elements LD exposed by the insulating patterns INP1 and INP2.

The connecting electrodes ELT may be located on the first and second end portions EP1 and EP2 of the light emitting elements LD exposed by the insulating patterns INP1 and INP2. Each of the connecting electrodes ELT may be made of various transparent conductive materials. For example, the connecting electrodes ELT may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO), and they may be implemented to be substantially transparent or translucent to satisfy a desired transmittance (e.g., a set or predetermined transmittance). Accordingly, the light emitted from the first and second end portions EP1 and EP2 of the light emitting elements LD may pass through the connecting electrodes ELT to be emitted to the outside of the display panel PNL.

The connecting electrodes ELT may be located at the same layer, as shown in FIG. 6 and the like. That is, the connecting electrodes ELT may be formed of the same conductive layer. In this case, the connecting electrodes ELT may be concurrently formed (e.g., substantially simultaneously formed) at the same process. As described above, because the connecting electrodes ELT may be naturally separated and formed at the same time by using the concave-convex structure of the side surface of the second insulating pattern INP2, it is possible to reduce the number of masks to simplify the manufacturing process of the display device.

Each of the connecting electrodes ELT may be electrically connected to at least one of the electrodes ALE through the contact hole CH penetrating the insulating layer INS located therebelow. For example, the first connecting electrode ELT1 may be electrically connected to the first electrode ALE1 through the first contact hole CH1 penetrating the insulating layer INS. The second connecting electrode ELT2 may be electrically connected to the second electrode ALE2 through the second contact hole CH2 penetrating the insulating layer INS. The third connecting electrode ELT3 may be electrically connected to the third electrode ALE3 through the third contact hole CH3 penetrating the insulating layer INS. The fourth connecting electrode ELT4 may be electrically connected to the fourth electrode ALE4 through the fourth contact hole CH4 penetrating the insulating layer INS.

In one or more embodiments, the connecting electrodes ELT may contact the side surface of the first insulating pattern INP1. For example, as shown in FIG. 8, the first connecting electrode ELT1 contacting the first end portion EP1 of the first light emitting elements LD1 may contact one side of the first insulating pattern INP1, and the third connecting electrode ELT3 contacting the second end portion EP2 of the first light emitting elements LD1 may contact the other side of the first insulating pattern INP1.

In one or more embodiments, a conductive pattern CP may be located on the side surface of the second insulating pattern INP2. In one or more embodiments, the conductive pattern CP may be formed of the same conductive layer as the connecting electrodes ELT. That is, the conductive pattern CP may be made of the same material as that of the connecting electrodes ELT. The conductive pattern CP may be concurrently formed (e.g., substantially simultaneously formed) in the same process as the connecting electrodes ELT. In this case, the conductive pattern CP may be naturally separated from the connecting electrodes ELT due to the concavo-convex shape on the side surface of the second insulating pattern INP2 to remain on the side surface of the second insulating pattern INP2. For example, as shown in FIG. 8, the conductive pattern CP may be partially located on the side surface of the first inorganic layer IOL1 due to the concavo-convex shape of the second insulating pattern INP2. The conductive pattern CP may be directly located on the side surface of the first inorganic layer IOL1 to contact the side surface of the first inorganic layer IOL1. In this case, the conductive pattern CP may not contact the side surface of the second inorganic layer IOL2.

The conductive pattern CP may include the same material as the connecting electrodes ELT. For example, the conductive pattern CP may be made of various transparent conductive materials. For example, the conductive pattern CP may include at least one of various transparent materials such as an indium tin oxide (ITO), an indium zinc oxide (IZO), an indium tin zinc oxide (ITZO), a zinc oxide (ZnO), an aluminum zinc oxide (AZO), a gallium zinc oxide (GZO), a zinc tin oxide (ZTO), a gallium tin oxide (GTO), or a fluorine tin oxide (FTO).

According to the above-described embodiments, because the connecting electrodes ELT may be naturally separated by the side protrusions and depressions of the second insulating pattern INP2, the likelihood of a short circuit between the connecting electrodes ELT may be reduced or prevented even if the connecting electrodes ELT are concurrently formed (e.g., substantially simultaneously formed). Accordingly, it is possible to reduce the number of masks and simplify a manufacturing process of a display device.

Subsequently, a manufacturing method of the display device according to the above-described embodiments will be described.

FIG. 9-FIG. 13 illustrate cross-sectional views of process steps of a manufacturing method of a display device according to one or more embodiments. FIG. 9-FIG. 13 are cross-sectional views for explaining the manufacturing method of the display device of FIG. 8, and constituent elements that are substantially the same as those of FIG. 8 are denoted by the same reference numerals, and detailed descriptions thereof will be omitted.

Figure 9:
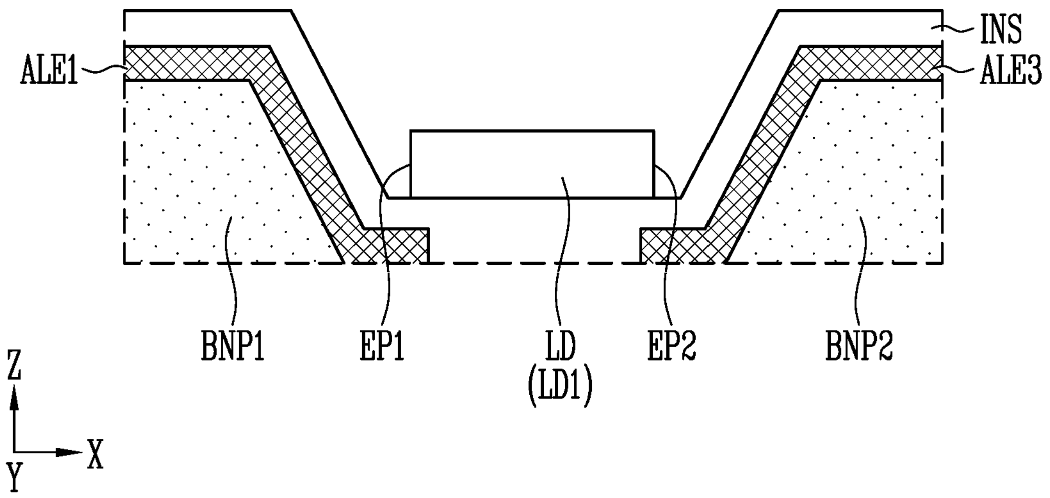
FIG. 9-FIG. 13 illustrate cross-sectional views of process steps of a manufacturing method of a display device according to one or more embodiments.

Referring to FIG. 9, first, the electrodes ALE that are spaced from each other are formed. An insulating layer INS may be formed on the electrodes ALE and at a space between the electrodes ALE. The light emitting elements LD may be supplied and aligned between the electrodes ALE that are spaced from each other. The light emitting elements LD may be located on the insulating layer INS. For example, the first and third electrodes ALE1 and ALE3 may receive a first alignment signal (or first alignment voltage) and a second alignment signal (or second alignment voltage), respectively, in an alignment step of the light emitting elements LD. For example, one of the first and third electrodes ALE1 and ALE3 may be supplied with an AC-type alignment signal, and the other one of the first and third electrodes ALE1 and ALE3 may be supplied with an alignment voltage (for example, a ground voltage) having a constant voltage level. The light emitting elements LD are supplied to the light emitting area of each pixel PXL through an inkjet method, a slit coating method, or various other methods, and they may be aligned with directionality between the electrodes ALE by a suitable alignment signal (e.g., a predetermined alignment signal) (or alignment voltage) applied to each of the electrodes ALE.

Figure 10:
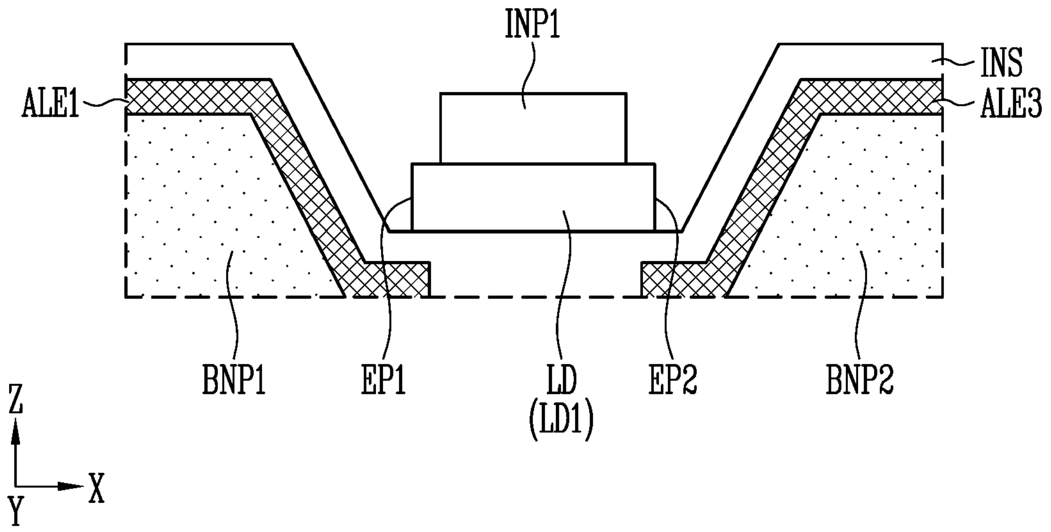

Referring to FIG. 10, subsequently, the first insulating pattern INP1 is formed on the light emitting elements LD.

The first insulating pattern INP1 may be partially formed on the light emitting elements LD to expose the first and second end portions EP1 and EP2 of the light emitting elements LD.

The first insulating pattern INP1 may be made of various types of inorganic insulating materials including a silicon oxide (SiOx), a silicon nitride (SiNx), a silicon oxynitride (SiOxNy), an aluminum nitride (AlNx), an aluminum oxide (AlOx), a zirconium oxide (ZrOx), a hafnium oxide (HfOx), or a titanium oxide (TiOx). However, it is not necessarily limited thereto, the first insulating pattern INP1 may be made of an organic insulating material such as an acrylates resin, an epoxy resin, a phenolic resin, a polyamides resin, a polyimides rein, a polyesters resin, a polyphenylenesulfides resin, or a benzocyclobutene (BCB).

Figure 11:
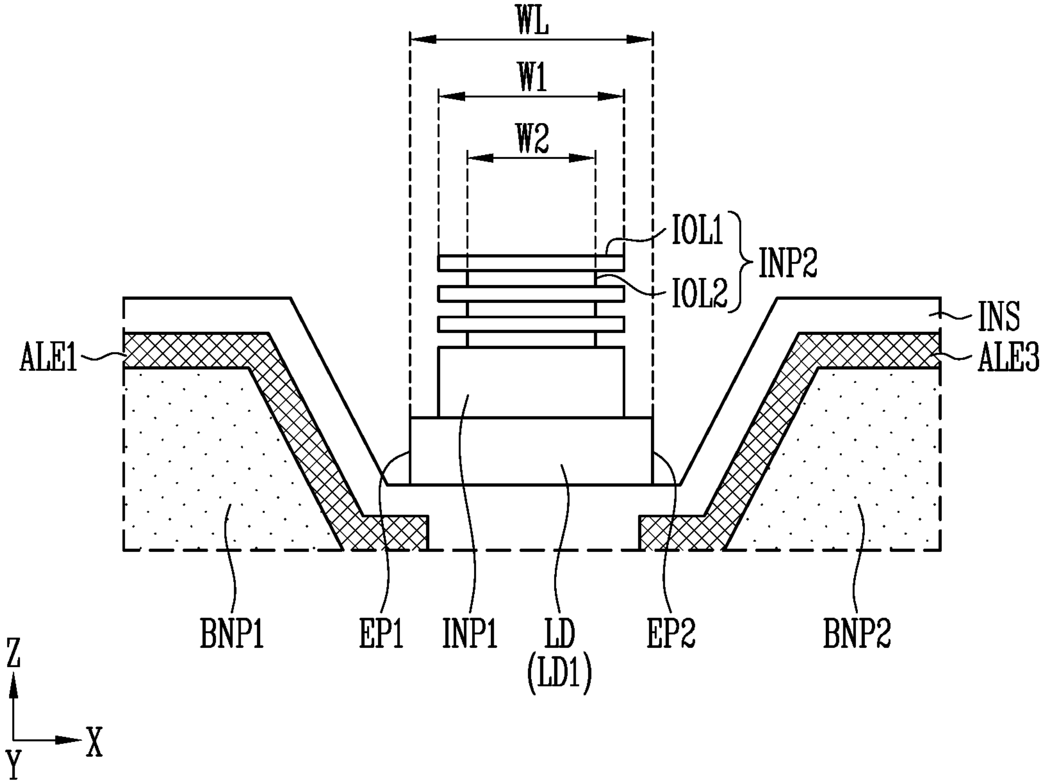

Referring to FIG. 11, next, the second insulating pattern INP2 is formed on the first insulating pattern INP1. The second insulating pattern INP2 may be formed by alternately depositing the first inorganic layers IOL1 and the second inorganic layers IOL2 and then etching them. In the process of etching the first and second inorganic layers IOL1 and IOL2, the protrusions and depressions on the side surface of the second insulating pattern INP2 may be implemented by using the difference in the etching selectivity between the first inorganic layer IOL1 and the second inorganic layer IOL2. For example, when the first inorganic layer IOL1 is made of a silicon oxide (SiOx) and the second inorganic layer IOL2 is made of a silicon nitride (SiNx), due to the difference in the etch selectivity between the first inorganic layer IOL1 and the second inorganic layer IOL2, the second inorganic layer IOL2 may be etched faster than the first inorganic layer IOL1. Accordingly, the width W1 of the first direction (X-axis direction) of the first inorganic layer IOL1 may be larger than the width W2 of the first direction (X-axis direction) of the second inorganic layer IOL2. However, the materials included in the first inorganic layer IOL1 and the second inorganic layer IOL2 are not necessarily limited thereto, and they may be variously changed within a range capable of implementing the concave-convex shape of the side surface of the second insulating pattern INP2 by using the difference in the etch selectivity between the first inorganic layer IOL1 and the second inorganic layer IOL2.

Figure 12:
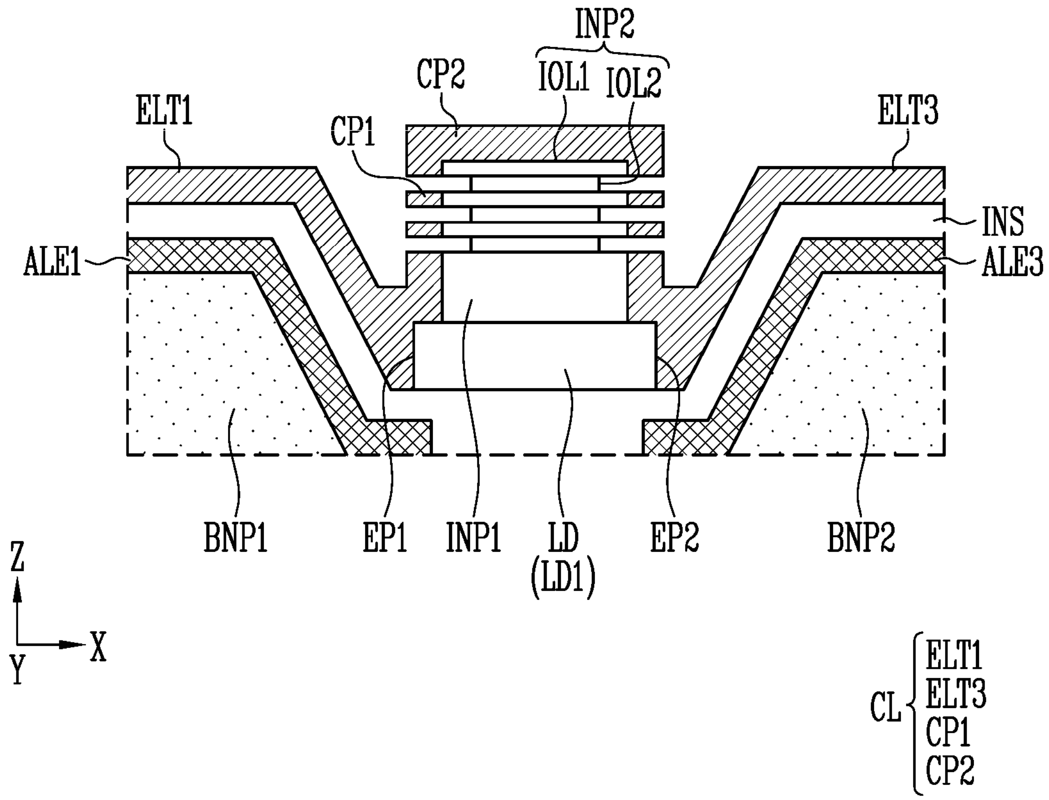

Referring to FIG. 12, subsequently, the connecting electrode layer CL is formed on the light emitting elements LD, the insulating layer INS, and the first and second insulating patterns INP1 and INP2. The connecting electrode layer CL may disconnected by the concavo-convex structure of the second insulating pattern INP2 to be divided into the first connecting electrode ELT1, the third connecting electrode ELT3, the first conductive pattern CP1, and the second conductive pattern CP2. For example, as the side surface of the second insulating pattern INP2 is formed to have the concavo-convex structure, the connecting electrode layer CL may be disconnected on the side surface of the second insulating pattern INP2 to be divided into the first connecting electrode ELT1, the third connecting electrode ELT3, the first conductive pattern CP1, and the second conductive pattern CP2. For example, the first connecting electrode ELT1 may be formed on the first end portions EP1 of the first light emitting elements LD1, the third connecting electrode ELT3 may be formed on the second end portions EP2 of the first light emitting elements LD1, the first conductive pattern CP1 may be formed on the side surfaces of the first inorganic layers IOL1 of the second insulating pattern INP2, and the second conductive pattern CP2 may be formed on the upper surface of the second insulating pattern INP2.

As described above, when the connecting electrode layer CL is naturally separated by the concavo-convex structure on the side surface of the second insulating pattern INP2, even if the connecting electrodes ELT are concurrently formed (e.g., substantially simultaneously formed), the likelihood of a short circuit between the connecting electrodes ELT may be reduced or prevented by the second insulating pattern INP2. Therefore, as described above, the number of masks may be reduced, and the manufacturing process of the display device may be simplified.

Figure 13:
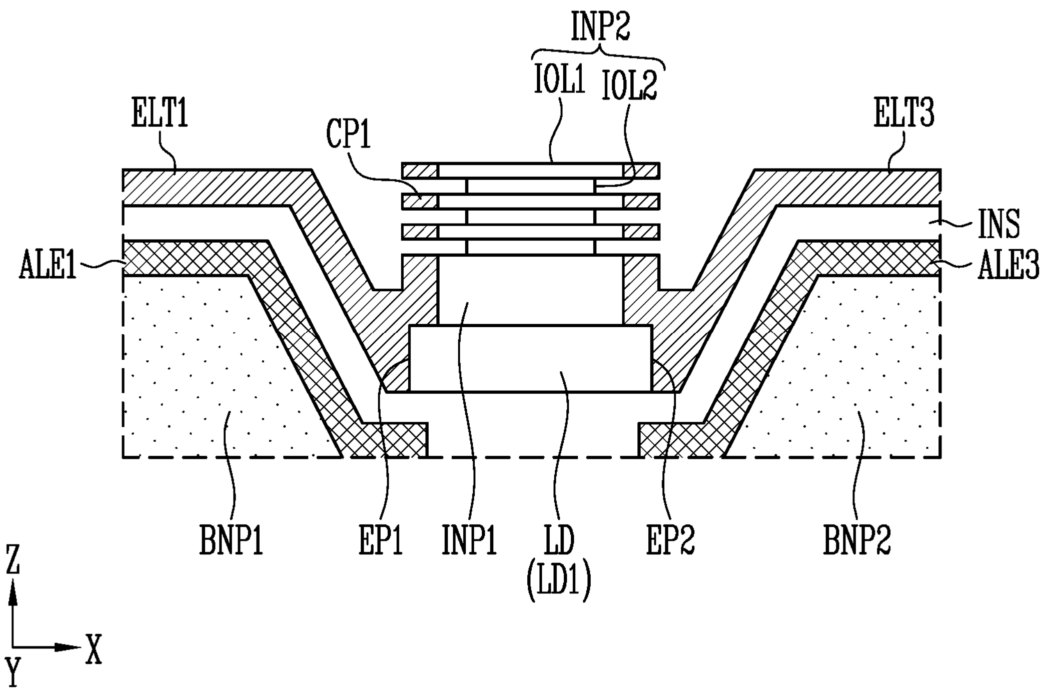

Referring to FIG. 13, subsequently, the second conductive pattern CP2 is etched and removed. The etching process may be performed by wet etching, but is not limited thereto. As described above, in the process of separating the connecting electrodes ELT, when the second conductive pattern CP2 formed or remaining on the upper surface of the second insulating pattern INP2 is removed, it is possible to more effectively reduce or prevent the likelihood of the connecting electrodes ELT being short-circuited.

Those skilled in the art related to the present disclosure will readily appreciate that many modifications are possible without materially departing from the spirit and scope of the present disclosure. One or more embodiments should be considered in a descriptive sense only and not for purposes of limitation. The scope and spirit of the present disclosure, not by the detailed description given in the appended claims, and all differences within the equivalent scope will be construed as being included in the present disclosure, with functional equivalents of the claims to be included therein.

What is claimed is:

1. A display device comprising:
a first electrode and a second electrode that are spaced from each other;
a light emitting element between the first electrode and the second electrode;
a first connecting electrode contacting the first electrode and a first end of the light emitting element;
a second connecting electrode contacting the second electrode and a second end of the light emitting element;
a first insulating pattern between the first connecting electrode and the second connecting electrode, the first insulating pattern being above the light emitting element;
a second insulating pattern comprising two or more first inorganic layers and two or more second inorganic layers having different widths in a first direction parallel to a length of the light emitting element and alternately stacked with each other along a second direction perpendicular to the length of the light emitting element between the first connecting electrode and the second connecting electrode, the second insulating pattern being above the first insulating pattern; and
a conductive pattern,
wherein the two or more first inorganic layers comprise:
a first inorganic layer;
a second inorganic layer; and
a third inorganic layer,
wherein the two or more second inorganic layers comprise:
a fourth inorganic layer positioned under the first inorganic layer;
a fifth inorganic layer positioned between the first inorganic layer and the second inorganic layer; and
a sixth inorganic layer positioned between the second inorganic layer and the third inorganic layer,
wherein the first inorganic layer, the second inorganic layer, and the third inorganic layer have first planar surfaces parallel to the first direction, wherein the fourth inorganic layer, the fifth inorganic layer, and the sixth inorganic layer have second planar surfaces parallel to the first direction, wherein each of the first planar surfaces is wider than each of the second planar surfaces in the first direction, wherein the conductive pattern is in direct contact with a side surface of the first inorganic layer, and wherein a top surface of the first inorganic layer is exposed from the conductive pattern.

2. The display device of claim 1, wherein a width of the first inorganic layer of the first inorganic layers is greater than a width of the second inorganic layer of the second inorganic layers.

3. The display device of claim 2, wherein the width of the first inorganic layer is less than a width of the light emitting element.

4. The display device of claim 3, wherein the first inorganic layer comprises silicon oxide, and wherein the second inorganic layer comprises silicon nitride.

5. The display device of claim 4, wherein the conductive pattern does not contact the second inorganic layer.

6. The display device of claim 5, wherein the conductive pattern is separated from the first connecting electrode and the second connecting electrode.

7. The display device of claim 6, wherein the conductive pattern comprises a same material as the first connecting electrode and the second connecting electrode.

8. The display device of claim 7, wherein the first connecting electrode contacts a first side of the first insulating pattern, and wherein the second connecting electrode contacts a second side of the first insulating pattern.

9. The display device of claim 8, wherein the first insulating pattern exposes the first end and the second end of the light emitting element.

10. The display device of claim 9, wherein the first insulating pattern comprises an inorganic insulating material.

11. The display device of claim 9, wherein the first insulating pattern comprises an organic insulating material.

12. The display device of claim 11, wherein the first connecting electrode and the second connecting electrode comprise a same material.

13. The display device of claim 12, wherein the first connecting electrode and the second connecting electrode are at a same layer.

* * * * *